(12) United States Patent
Udrea

(10) Patent No.: US 7,465,964 B2
(45) Date of Patent: Dec. 16, 2008

(54) SEMICONDUCTOR DEVICE IN WHICH AN INJECTOR REGION IS ISOLATED FROM A SUBSTRATE

(75) Inventor: Florin Udrea, Cambridge (GB)

(73) Assignee: Cambridge Semiconductor Limited, Cambridge (GB)

(*) Notice: Subject to any disclaimer, the term of this patent is extended or adjusted under 35 U.S.C. 154(b) by 27 days.

(21) Appl. No.: 11/321,051

(22) Filed: Dec. 30, 2005

(65) Prior Publication Data

US 2007/0158678 A1    Jul. 12, 2007

(51) Int. Cl.
*H01L 29/735* (2006.01)
(52) U.S. Cl. .............. 257/122; 257/119; 257/120; 257/E29.187; 323/240; 323/325
(58) Field of Classification Search ......... 257/119–124, 257/110; 323/240, 325
See application file for complete search history.

(56) References Cited

U.S. PATENT DOCUMENTS

| | | | | |
|---|---|---|---|---|
| 4,963,951 | A | * | 10/1990 | Adler et al. ............... 257/141 |
| 5,793,064 | A | * | 8/1998 | Li ............................ 257/119 |
| 6,703,684 | B2 | | 3/2004 | Udrea et al. |
| 6,900,518 | B2 | | 5/2005 | Udrea et al. |
| 6,927,102 | B2 | | 8/2005 | Udrea et al. |
| 2001/0050375 | A1 | * | 12/2001 | Van Dalen ............... 257/141 |
| 2002/0041003 | A1 | * | 4/2002 | Udrea et al. ............. 257/502 |

FOREIGN PATENT DOCUMENTS

WO    WO 02/25700 A2    3/2002

OTHER PUBLICATIONS

F. Udrea et al. ("Lateral insulated gate bipolar transistor (LIGBT) structure based on partial isolation SOI technology," Electronics Letters, vol. 33, No. 10, pp. 907-909, May 8, 1997.).*
Lim et al., ("Modelling of self-heating effect in thin SOI and Partial SOI LDMOS power devices", Solid-State Electronics, vol. 43, Issue 7, Jul. 1999, pp. 1267-1280).*
Udrea et al., "Lateral insulated gate bipolar transistor (LIGBT) structure based on partial isolation SOI technology", Electronics Letters, vol. 33, No. 10, May 8, 1997, pp. 907-909.
Udrea et al., "Breakdown analysis in JI, SOI and partial SOI power structures", Proceedings 1997 IEEE International SOI Conference, Oct. 1997, pp. 102-103.

(Continued)

*Primary Examiner*—Sue A Purvis
*Assistant Examiner*—Jami M Valentine
(74) *Attorney, Agent, or Firm*—Pillsbury Winthrop Shaw Pittman LLP

(57) ABSTRACT

A high voltage/power semiconductor device has a substrate, an insulating layer on the substrate, and a semiconductor layer on the insulating layer. Low and high voltage terminals are connected to the semiconductor layer. The device has a control terminal. The semiconductor layer includes a drift region and a relatively highly doped injector region between the drift region and the high voltage terminal. The device has a relatively highly doped region in electrical contact with the highly doped injector region and the high voltage terminal and forming a semiconductor junction with the substrate. The combination of the insulating layer and the relatively highly doped region of the first conductivity type effectively isolate the highly doped injector region from the substrate.

17 Claims, 23 Drawing Sheets

OTHER PUBLICATIONS

Letavic et al., "High Performance 600 V Smart Power Technology Based on Thin Layer Silicon-on-Insulator", IEEE, Feb. 1997, pp. 49-52.

"Novel Silicon-on-Insulator MOSFET for High-Voltage Integrated Circuits," Electronics Letters, vol. 25, No. 8, Apr. 13, 1989, pp. 536-537.

Merchant et al., "Realization of High Breakdown Voltage (> 700 v) in Thin SOI Devices", ICCC, IEEE, 1991, pp. 31-35.

Udrea et al., "3D RESURF double-gate MOSFET: A revolutionary power device concept", Electronics Letters, vol. 34, No. 8, Apr. 16, 1998, pp. 808-809.

* cited by examiner

SEMICONDUCTOR DEVICE IN WHICH AN INJECTOR REGION IS ISOLATED FROM A SUBSTRATE

The present invention relates to a semiconductor device and a method of forming a semiconductor device.

The present invention is particularly concerned with high voltage semiconductor devices which can be used in power integrated circuits and is particularly concerned with MOS controlled devices with bipolar action such as lateral insulated gate bipolar transistors (LIGBTs), bipolar transistors in general and MOS-controlled thyristors.

Lateral devices in integrated circuits have the main terminals (variously called the anode/cathode, drain/source and collector/emitter) and the control terminals (termed the gate or base) placed at the surface of the device in order to be easily accessible. In power ICs, such devices are often monolithically integrated with CMOS-type or BiCMOS-type low voltage/low power circuits. It is desirable that one or several high voltage/power devices be integrated within the same chip.

There are two main technologies that have emerged in the high voltage/power integrated circuit field. The first, Junction-Isolation (JI) technology, is based on using reverse-biased junctions for isolating adjacent devices. In this technology, the high voltage device incorporates a high voltage RESURF (Reduced SURface Field effect) type junction. This is based on a dual action of a lateral high voltage junction that comprises a drift region and a vertical junction that is formed between the drift region and the semiconductor substrate. The semiconductor substrate has a different conductivity type and is ideally more lowly doped than the drift region. In this case a depletion region forms deep into the semiconductor substrate (or a virtual substrate) as well as vertically in the drift region, resulting in a faster growth of the depletion region than that predicted by the one-dimensional Poisson theory. This allows the doping charge to be set at a higher value than that predicted by the one-dimensional Poisson theory. While this technique is satisfactory for unipolar devices such as MOSFETs, it is in most cases inappropriate for bipolar devices such as lateral insulated gate bipolar transistors. Indeed, mobile carriers resulting from the bipolar action of the transistor can move through the semiconductor substrate, affecting the operation of other devices. In addition the accumulation of plasma made of mobile carriers deep into the substrate can make the device very slow since during the turn-off such carriers are mainly eliminated via a slow recombination process.

The second main technology for high voltage/power ICs is the Silicon-On-Insulator technology (SOI) and is based on using pre-processed semiconductor wafers featuring a buried insulating layer, typically made of an oxide, sandwiched between an active layer of semiconductor (above the buried oxide) and a semiconductor substrate (below the buried oxide). As in the Junction-Isolation technology, a high voltage device made in SOI technology incorporates a high voltage junction within the active area of the device to support laterally the voltage between a high voltage terminal and a low voltage terminal. However unlike in the junction-isolation technology, no depletion region builds in the substrate. This is because the semiconductor substrate beneath the buried oxide acts as a field plate. In this case all the potential lines eventually have to align with the buried oxide/semiconductor interface as the entire high voltage is dropped vertically across the oxide. This imposes a severe limit on the breakdown ability of the device in spite of a fast growth of the depletion region in the drift region. A thicker buried oxide and/or the use of other buried insulating materials with lower dielectric constants will lead to a slightly higher breakdown. In general, it is not the buried oxide that breaks down first but the active layer of semiconductor (silicon) placed above. Indeed, the high electric field built in the buried oxide yields a high electric field in the semiconductor layer (at the interface with the buried oxide) which results in avalanche breakdown of the semiconductor. The buried oxide thickness or the use of other buried materials is limited by the technology. For buried oxides this thickness is about 4 µm. Besides, a buried oxide that is too thick will lead to self-heating which in turn damages the operation and the reliability of the power device.

For bipolar devices, such as the Insulated Gate Bipolar Transistor (IGBT), built in thin active silicon layers, some or all of the junctions can reach the buried oxide (as known in fully depleted or partially depleted SOI). In this case an undesirable punch-through type breakdown can occur. Referring to FIG. 1, which shows schematically a prior art LIGBT 1 using SOI technology, the voltage drop supported across the buried oxide 2 can lead to the formation of a surface hole inversion layer in the n-buffer (n-well) 3 and the n-drift region 4 via the back gate MOS effect. When this inversion layer connects to the depletion region extending from the p-well 5/n-drift 4 junction, an undesirable punch-through effect occurs. The punch-through is therefore dependent on the thickness of the buried oxide 2. For example for a typical n-well 3 concentration of $3 \times 10^{16}$ cm$^{-3}$, the n-well 3 becomes inverted at about 30 V per every 1 µm of buried oxide 2. This undesirable punch-through breakdown is in many cases well below the actual avalanche breakdown of the device and therefore severely limits the breakdown ability of such structures.

Several proposals have been made to increase the breakdown ability of SOI high voltage devices. These include the linearly graded profile (see for example Merchant S. et al., "Realization of high breakdown voltage (>700 V) in thin SOI devices", ISPSD '91 p. 31, 1991; and Letavic T. et al., "High performance 600 V smart power technology based on thin layer silicon-on-insulator", ISPSD '97, p. 49, 1997); the membrane technology (see for example WO-A-02/25700, U.S. Pat. No. 6,703,684, U.S. Pat. No. 6,900,518 and U.S. Pat. No. 6,927,102, the entire contents of which are hereby incorporated by reference); and the 3D RESURF (superjunction) technology (see for example Udrea F., Popescu A. and Milne W. I., "The 3D RESURF double-gate MOSFET: A revolutionary power device concept", Electronic Letters, vol. 34, no. 8, p. 808, 1998). Some of these proposals are based on using thick layers of buried oxide (which is not standard in mainstream CMOS SOI) or, in the case of membrane technology, a thick dielectric (of air) underneath the active area of the device. The membrane technology in particular involves an extra step of back-etching, causing the power device to be exposed to extra thermal and mechanical stress during manufacture which needs to be carefully minimised.

Another approach reported in the literature (see for example F. Udrea, A. Popescu and W. Milne, "Breakdown analysis in JI, SOI and partial SOI power structures", IEEE International SOI Conference, pp 102-103, October 1997; Ratnam p., "Novel silicon on insulator MOSFET for high voltage integrated circuits", Electronic Letters, vol. 25, no. 8, p. 536, 1989; and, Udrea F., Popescu A. and Milne W. I., "A new LIGBT structure based on partial isolation SOI technology", Electronic Letters, vol. 33, no. 10, p. 907, May 1997) is to combine the ability of JI technology to support the breakdown with the good SOI isolation offered by the SOI technology. This technology allows use of thinner buried oxides and is applicable to both unipolar devices such as the LDMOSFET or bipolar devices such as the LIGBT.

FIG. 2 shows schematically a prior art LIGBT 6 using the partial SOI technology. Provided that the buried oxide 7 is uninterrupted under the CMOS blocks (not shown), this technology provides an enhanced level of isolation when compared to JI technology. However the use of this technology for bipolar devices such as the LIGBTs is limited. Referring to FIG. 3, this is because in the on-state of the device, a parasitic pnp transistor 8 forms between the p+ anode injector (emitter) 9, the n-well 10/n drift (base) 11, and the p− substrate (collector) 12. The injection of parasitic carriers deep into the silicon substrate 12, as shown schematically in FIG. 4, leads to high turn-off losses and long turn-off times, which is unacceptable for many applications. In addition these parasitic carriers can move through the substrate and affect the operation of other power devices or other CMOS blocks within the integrated circuit.

In U.S. Pat. No. 5,113,236 there is disclosed a partial SOI integrated circuit with a very lowly doped substrate and a separate diffusion (n− type) which is located outside the integrated circuit to improve the breakdown of devices located within the integrated circuit.

Power devices operated in integrated circuits typically operate with a voltage in the range 20V to 1.2 kV and typically higher than 30V or 50V or so. Power devices typically operate with a current in the range 10 mA to 50 A and typically higher than 0.1 A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control, and power supplies to RF and microwave circuits and telecommunication systems.

It will be appreciated that the terms "top" and "bottom", "above" and "below", and "lateral" and "vertical", are all used in this specification by convention and that no particular physical orientation of the device as a whole is implied.

According to a first aspect of the present invention, there is provided a high voltage/power semiconductor device, the device comprising: a relatively lowly doped substrate; an insulating layer on the substrate; a semiconductor layer on the insulating layer; a low voltage terminal and a high voltage terminal each electrically connected to the semiconductor layer; a control terminal; the semiconductor layer including a drift region of a first conductivity type, the substrate being of the second conductivity type; the semiconductor layer including a relatively highly doped injector region of the second conductivity type between the drift region and the high voltage terminal, said relatively highly doped injector region being in electrical contact with the high voltage terminal and not being connected via any semiconductor layer to the substrate; and, a relatively highly doped region of the first conductivity type in electrical contact with the said highly doped injector region and the high voltage terminal and forming a semiconductor junction with the substrate; the combination of the insulating layer and the relatively highly doped region of the first conductivity type effectively isolating the highly doped injector region from the substrate.

This arrangement prevents formation of the parasitic transistor that typically forms in prior art LIGBTs as discussed above. This means that the ideal situation of the injector region injecting charge carriers solely into the drift region (and not into the substrate) can be more closely approached. In practice, the relatively highly doped region of the first conductivity type is physically close to the highly doped injector region.

In a particular example, the preferred embodiment is an LIGBT that effectively has an anti-parallel body diode, the anti-parallel diode comprising the semiconductor junction formed between the said relatively highly doped region of the first conductivity type and the substrate.

In an embodiment, the device comprises plural relatively highly doped injector regions of the second conductivity type between the drift region and the high voltage terminal, said relatively highly doped injector regions each being in electrical contact with the high voltage terminal and not being connected via any semiconductor layer to the substrate, and a corresponding plurality of relatively highly doped regions of the first conductivity type in electrical contact with the respective relatively highly doped injector regions and the high voltage terminal and forming a corresponding plurality of semiconductor junctions with the substrate. The relatively highly doped regions of the first conductivity type are in close proximity to the respective highly doped injector regions.

In an embodiment, the device comprises a buffer region of the first conductivity type between the drift region and said relatively highly doped injector region. In this embodiment, the injector region injects mobile carriers via the buffer layer into the drift region. This leads to conductivity modulation of the drift region.

In an embodiment, the device comprises a relatively highly doped region of the first conductivity type electrically connected to the low voltage terminal. The device may comprise a relatively highly doped region of the second conductivity type electrically connected to the low voltage terminal. There may be provided a well region of the second conductivity type between the drift region and the or each relatively highly doped region that is electrically connected to the low voltage terminal. An insulated gate may be provided at the upper surface of said well region of the second conductivity type and at the upper surface of part of the relatively highly doped region of the first conductivity type and at the upper surface of part of the drift region. As is known per se, this insulated gate forms a MOS transistor structure which can be used to control the operation of the power device. The insulated gate may comprise a thin insulating layer and a highly doped semiconductor layer (e.g. of polysilicon) and/or a metal layer connected to the control terminal (i.e. a gate terminal in this example).

In an embodiment, the device comprises a relatively highly doped region of the second conductivity type adjacent the low voltage terminal, said relatively highly doped region of the second conductivity type electrically connecting the substrate to the low voltage terminal. In an embodiment, this effectively provides an LIGBT in combination with a lateral anti-parallel body diode.

In an embodiment, the substrate has at least two layers, a first layer of the substrate adjacent the insulating layer being relatively lowly doped of the second conductivity type, and a second layer of the substrate adjacent said first layer being relatively highly doped of the first or second conductivity type. This arrangement constrains the anti-parallel body diode to be only within the upper, more lowly doped layer of the substrate.

In an embodiment, the device comprises a buffer region of the first conductivity type around said relatively highly doped region of the first conductivity type in electrical contact with the high voltage terminal and forming a semiconductor junction with the substrate. This buffer region "smoothes" the junction between the highly doped region and the substrate, which serves to decrease the peak of the electric field at the physical junction and hence increase the breakdown voltage The drift region may include plural regions of alternating conductivity type extending longitudinally of the device. This arrangement allows an optimal charge compensation to be made, which achieves an optimal breakdown capability for the device.

In an embodiment, the device comprises a further relatively highly doped region of the first conductivity type between the high voltage terminal and the injector region, the high voltage terminal being electrically connected to both this further relatively highly doped region of the first conductivity type and the injector region.

In an embodiment, the device comprises an insulating region between the high voltage terminal and the injector region. This additional insulating region, which may be an oxide region, makes it easier during manufacture to etch through the top of the semiconductor layer and the buried insulating layer during formation of the highly doped region of the first conductivity type within the substrate. The injector region and the highly doped region of the first conductivity type are both connected to the high voltage terminal.

In an embodiment, the device comprises at least one trench in the drift region, the at least one trench having formed underneath a further relatively highly doped region of the first conductivity type. In an example, the additional highly doped region is not connected directly to one of the main terminals of the device and is therefore floating. The purpose of these additional highly doped regions is to spread the depletion region into the substrate in a more favourable way and thus improve the breakdown voltage capability of the device.

In an embodiment, the device is a lateral insulated gate bipolar transistor (LIGBT) and comprises an anti-parallel diode, the anti-parallel diode containing at least one semiconductor junction formed between the said relatively highly doped region of the first conductivity type and the substrate of the second conductivity type.

In an embodiment, the device is a lateral insulated gate bipolar transistor (LIGBT) where the substrate takes a large fraction of the blocking voltage while the device is in the off-state and/or during transient signals while there is virtually no injection of mobile carriers into the substrate during on-state.

According to a second aspect of the present invention, there is provided a method of forming a high voltage/power semiconductor device, the method comprising: forming a top side semiconductor layer on a buried insulating layer placed on a substrate; forming a relatively lowly doped drift region of a first conductivity type in the top side semiconductor layer, the substrate being of the second conductivity type; forming by implantation and/or diffusion an injector region of the second conductivity type in the top side semiconductor layer; and, etching through the top side semiconductor layer and/or any other insulating materials within or in close proximity to the injector region, followed by etching through the buried insulating layer to expose the semiconductor substrate, followed by implantation and/or diffusion of a relatively highly doped region of the first conductivity type at the upper surface of the substrate to form a semiconductor junction with the semiconductor substrate.

In an embodiment, the relatively highly doped region of the first conductivity type is formed within the same fabrication step, using the same mask, as at least one of the other layers used in making the device.

In an embodiment, the device described above is integrated within a power integrated circuit that contains at least one n-channel MOS device, and the relatively. highly doped region of the first conductivity type is formed within the same fabrication step as the source/drain of said n-channel MOS device.

In an embodiment, the device is an LIGBT and the highly doped region of the first conductivity type is formed within the same fabrication step as the source/cathode of the LIGBT.

In an embodiment, a buffer region of the first conductivity type is formed within the exposed area of the substrate prior to the formation of the relatively highly doped region of the first conductivity type. This buffer region has a doping concentration lower than that of the highly doped layer of the first conductivity type and higher than that of the substrate. This buffer region is also more deeply driven in the substrate than the highly doped layer of the first conductivity type.

In an embodiment, the buffer region is formed within the same fabrication step, using the same mask, as at least one of the of the other layers used in making the device.

In an embodiment, the device described above is integrated within a power integrated circuit that contains at least one p-channel MOS device, and a buffer region of the first conductivity type is formed within the exposed area of the substrate prior to formation of the relatively highly doped region of the first conductivity type, the buffer region being formed within the same fabrication step as an n-well of said p-channel MOS device.

In an embodiment, the device is an LIGBT, and a buffer region of the first conductivity type is formed within the exposed area of the substrate prior to formation of the relatively highly doped region of the first conductivity type, the buffer region being formed within the same fabrication step as a buffer region that is adjacent a p+ anode injector region of the LIGBT.

In an embodiment, the method comprises implanting and/or diffusing a relatively highly doped region of the second conductivity type adjacent a low voltage terminal of the device, said relatively highly doped region of the second conductivity type electrically connecting the substrate to the low voltage terminal. The method may comprise etching through the top side semiconductor layer and/or any other insulating materials within or in close proximity to a low voltage terminal region of the device, followed by etching through the buried insulating layer, to expose the semiconductor substrate followed by implantation and/or diffusion of the said relatively highly doped region of the second conductivity type to form an ohmic contact to the semiconductor substrate. In an embodiment, the relatively highly doped region of the second conductivity type is formed within the same fabrication step, using the same mask, as at least one of the of the other layers used in making the device.

In an embodiment, the device described above is integrated within a power integrated circuit that contains at least one p-channel MOS device, and the method comprises implanting and/or diffusing a relatively highly doped region of the second conductivity type adjacent a low voltage terminal of the device, said relatively highly doped region of the second conductivity type electrically connecting the substrate to the low voltage terminal, the relatively highly doped region of the second conductivity type being formed within the same fabrication step as the source/drain of said p-channel MOS device.

In an embodiment, the device is an LIGBT, the method comprising implanting and/or diffusing a relatively highly doped region of the second conductivity type adjacent a low voltage terminal of the device, said relatively highly doped region of the second conductivity type electrically connecting the substrate to the low voltage terminal, the relatively highly doped region of the second conductivity type being formed within the same fabrication step as the short to the source/cathode of the LIGBT.

In an embodiment, plural trenches are etched through the top side semiconductor layer and the buried insulating layer to expose the semiconductor substrate, followed by implanting and/or diffusing corresponding layers of the first conductivity type to form multiple junctions with the substrate. In an embodiment, the trenches are filled with a highly doped semiconductor material (such as polysilicon) and/or metal and such layers are further connected to a high voltage terminal of the device. In another embodiment, the trenches are filled with a highly doped semiconductor material (such as polysilicon) and/or metal and such layers are electrically floating.

In an embodiment, any of the implanted/diffused layers are self-aligned to the trenches formed by etching through the top semiconductor layer or etching through the top side semiconductor layer and/or any other insulating materials within or in the close proximity of the injector region, followed by etching through the buried insulating layer, to expose the semiconductor substrate.

In an embodiment, the trenches formed by etching through various layers to expose the substrate are subsequently partially or fully filled with at least one layer of semiconductor and/or metal. Said at least one layer may be metal and be the same metal as that used in the standard metallization of the device or a power integrated circuit in which the device is integrated.

Embodiments of the present invention will now be described with reference to the accompanying drawings, in which.

Figure 21:
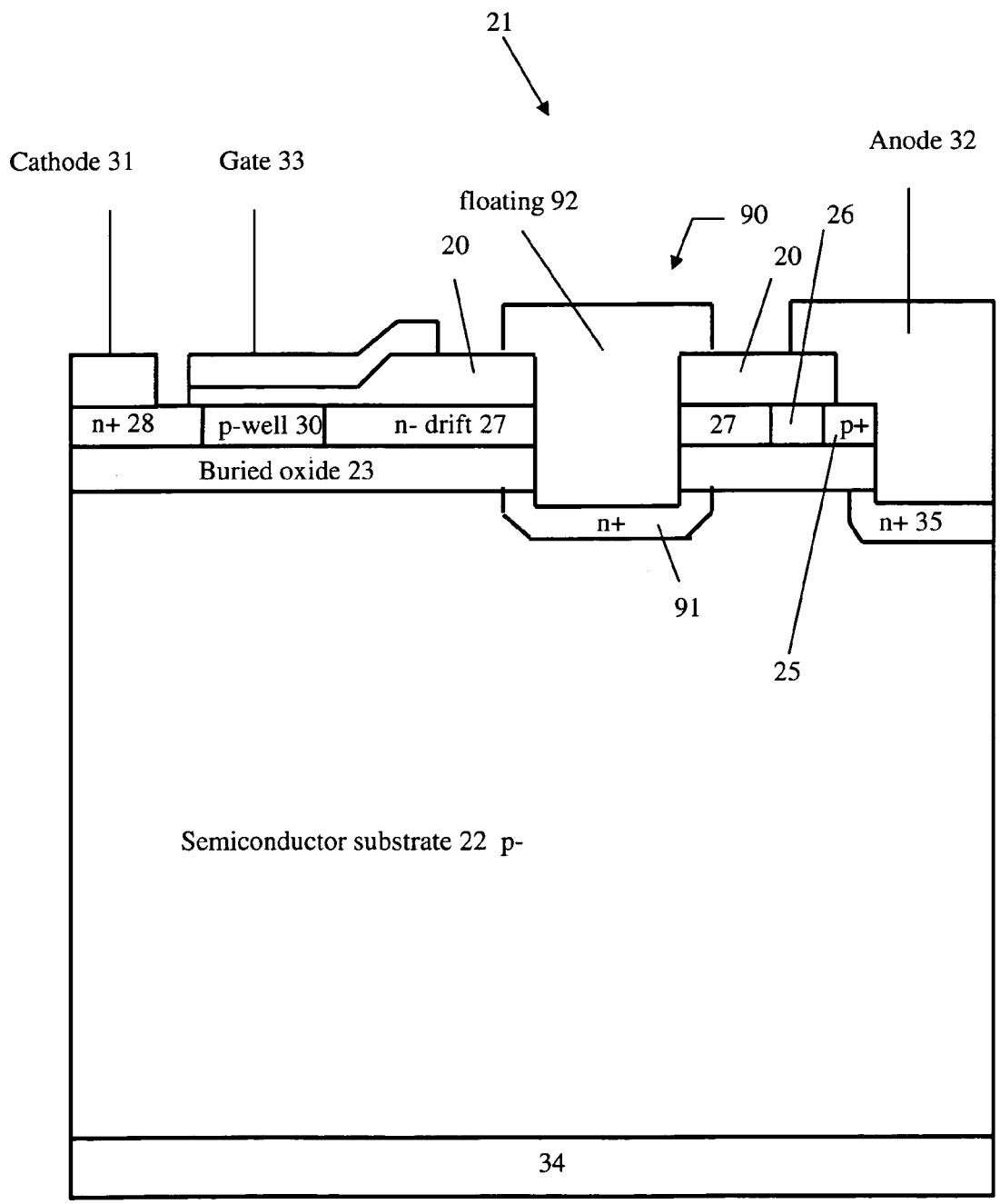
Figure 22:
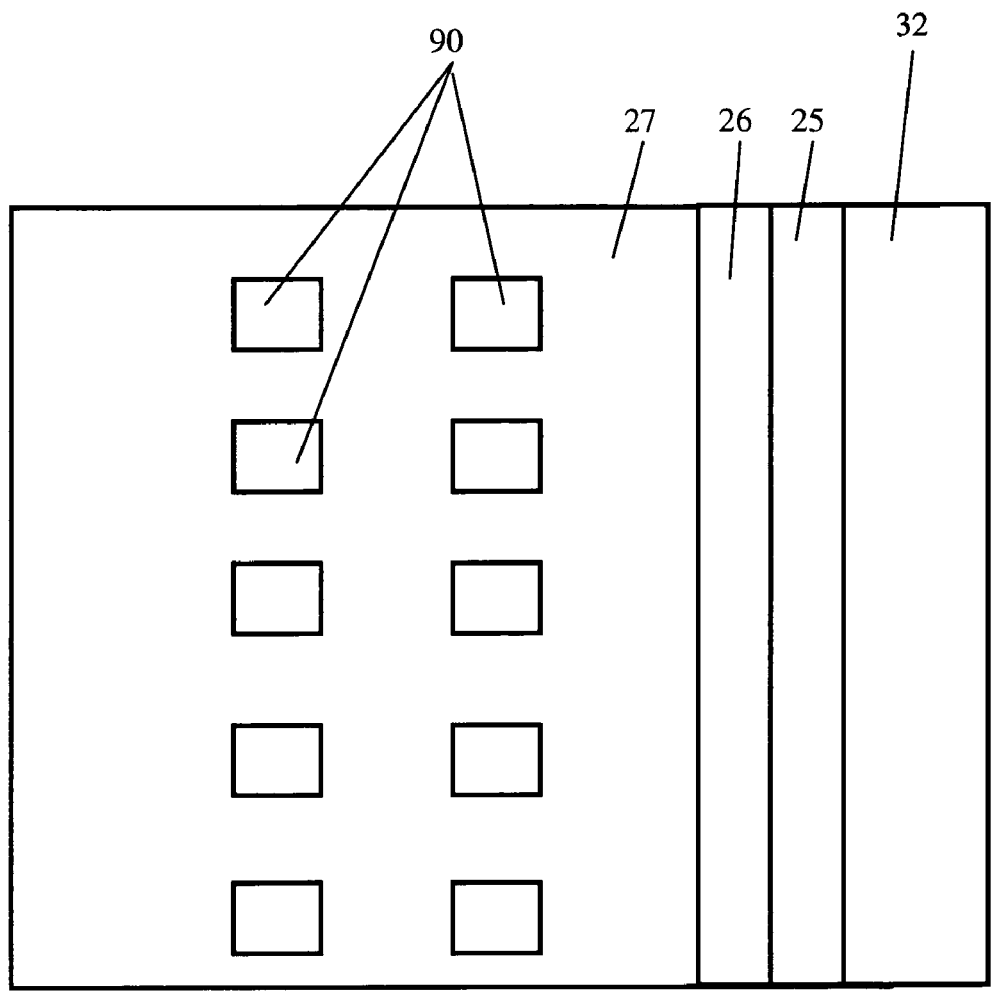
Figure 23:
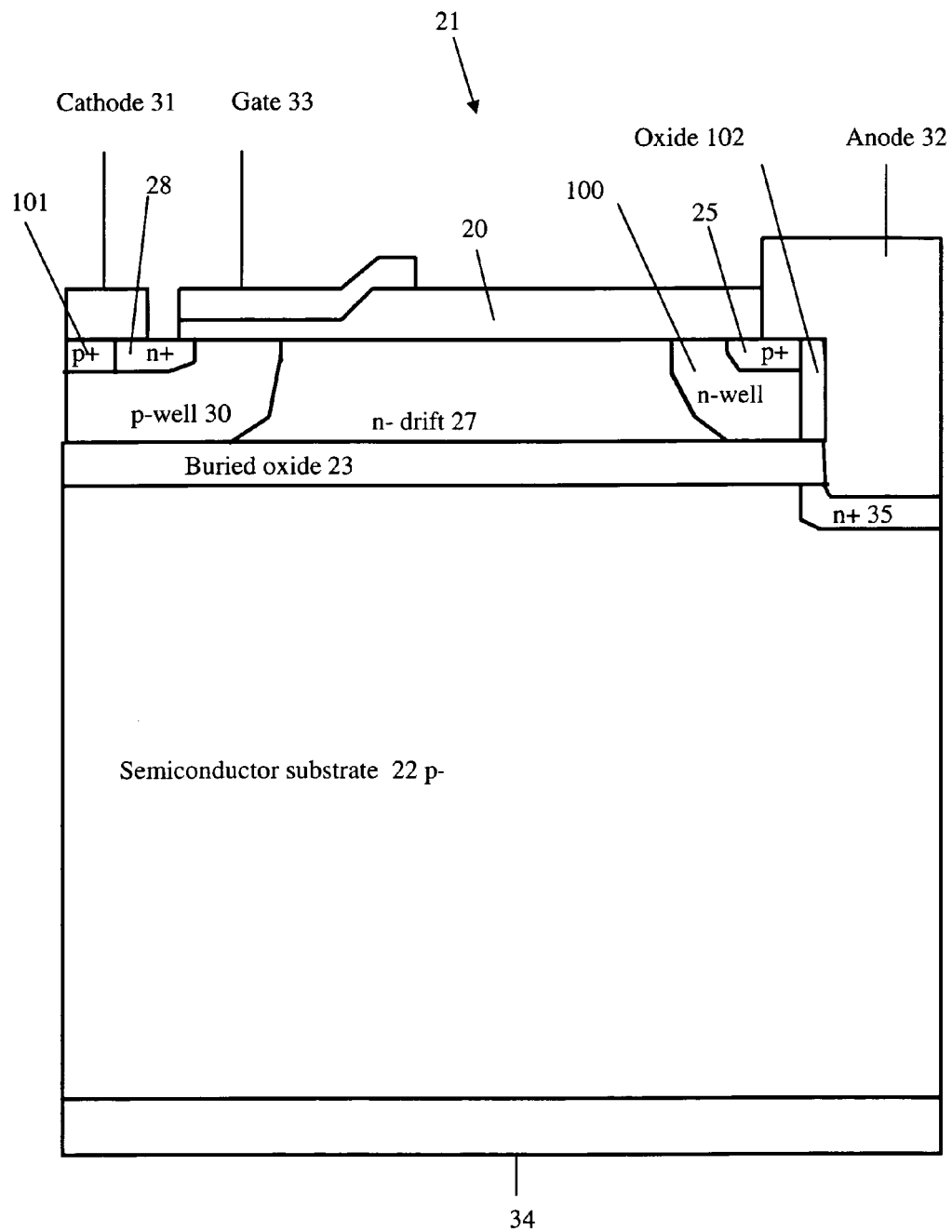

FIGS. 14(a) and 14(b) show equivalent circuits for examples of devices according to embodiments of the present invention;

FIGS. 15 to 20 are schematic perspective views and a plan view of further examples of devices in accordance with an embodiment of the present invention;

FIG. 21 is a schematic perspective view of another example of a device in accordance with an embodiment of the present invention;

FIG. 22 is a plan view that shows schematically an example of a device in accordance with an embodiment of the present invention; and, FIG. 23 is a schematic perspective view of another example of a device in accordance with an embodiment of the present invention.

Figure 1:
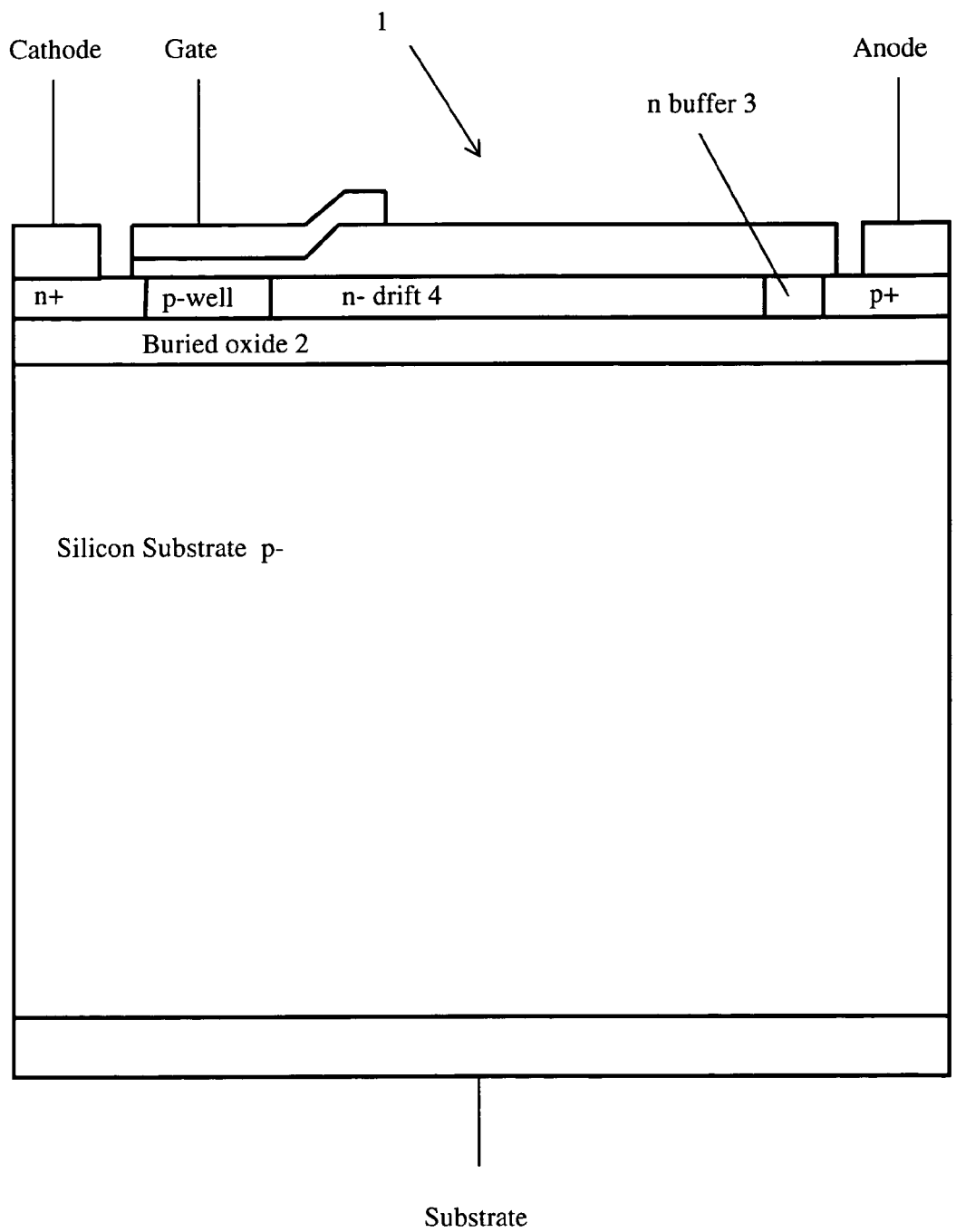
FIG. 1 is a schematic cross-sectional view of a prior art LIGBT using SOI technology.
Figure 2:
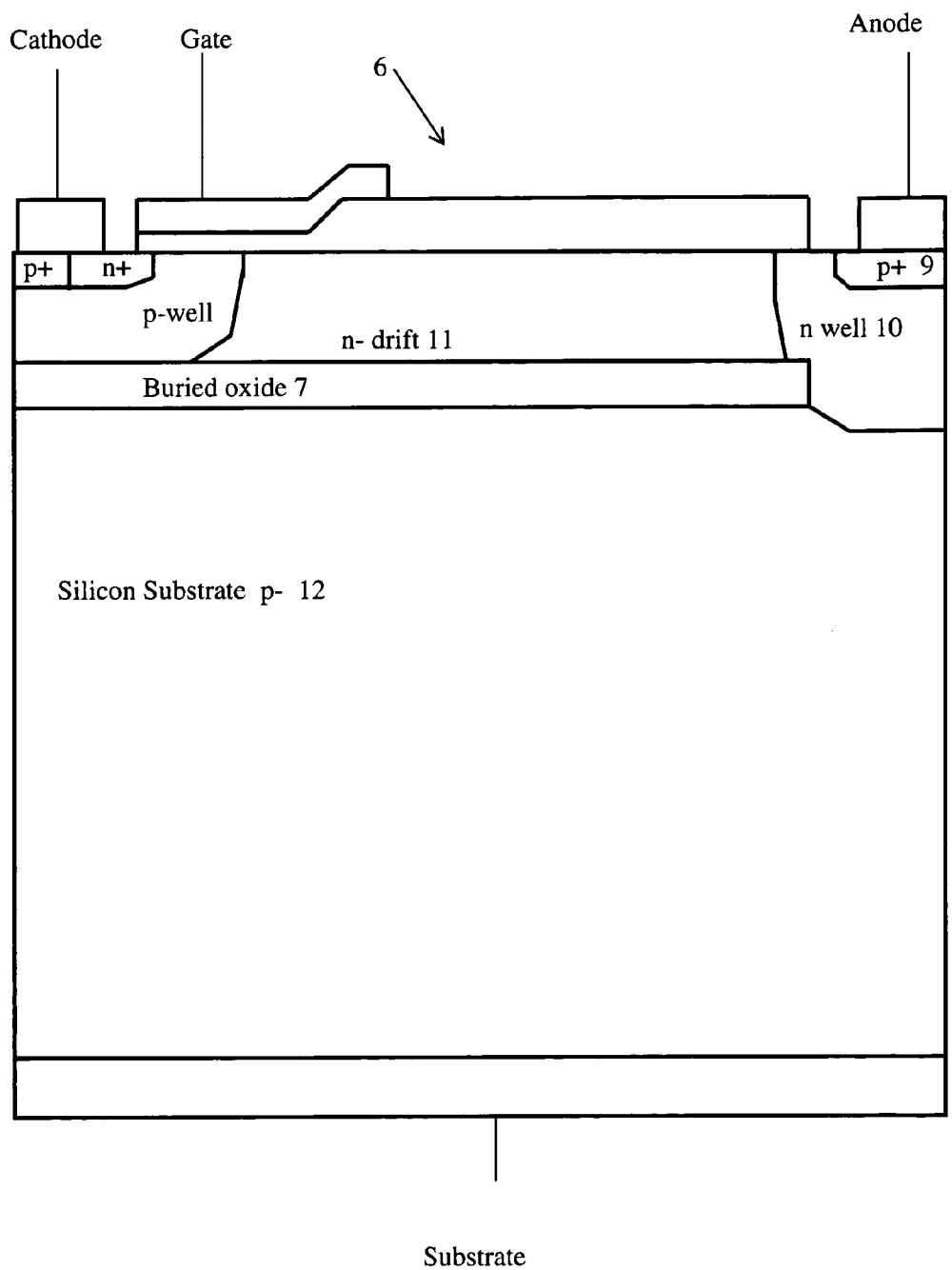
FIGS. 2 to 4 are schematic cross-sectional views of a prior art LIGBT using partial SOI technology.
Figure 3:
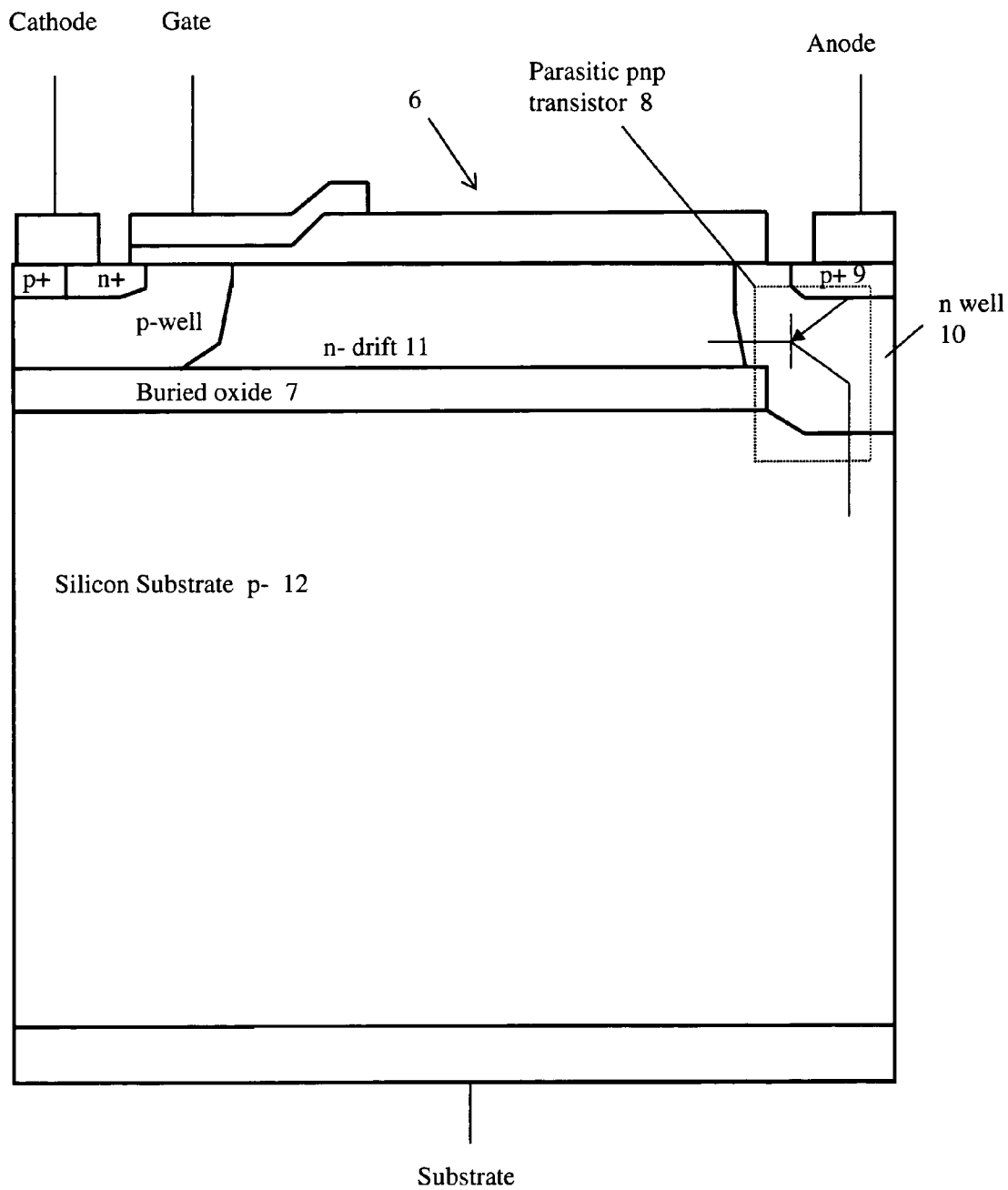
Figure 4:
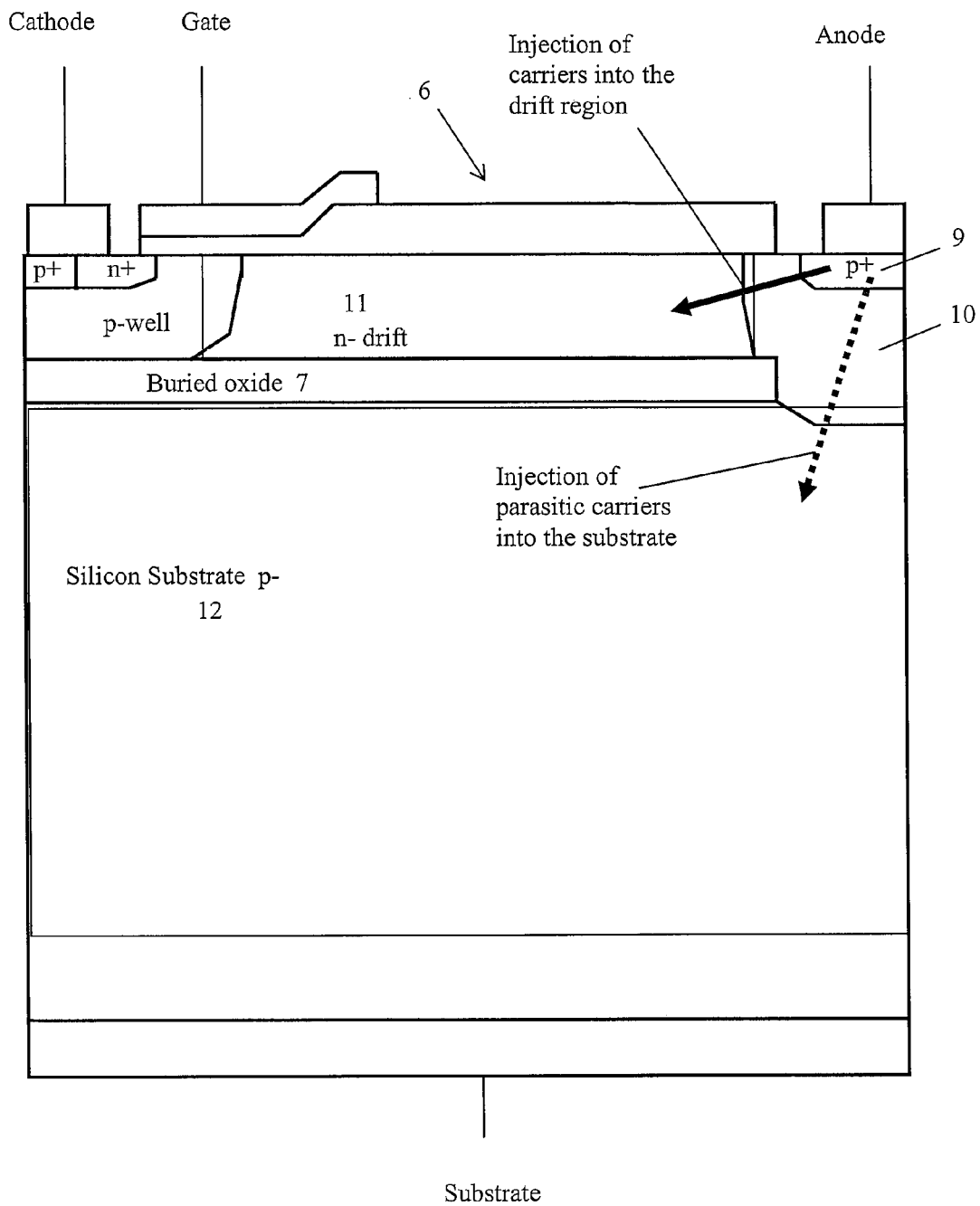
Figure 5:
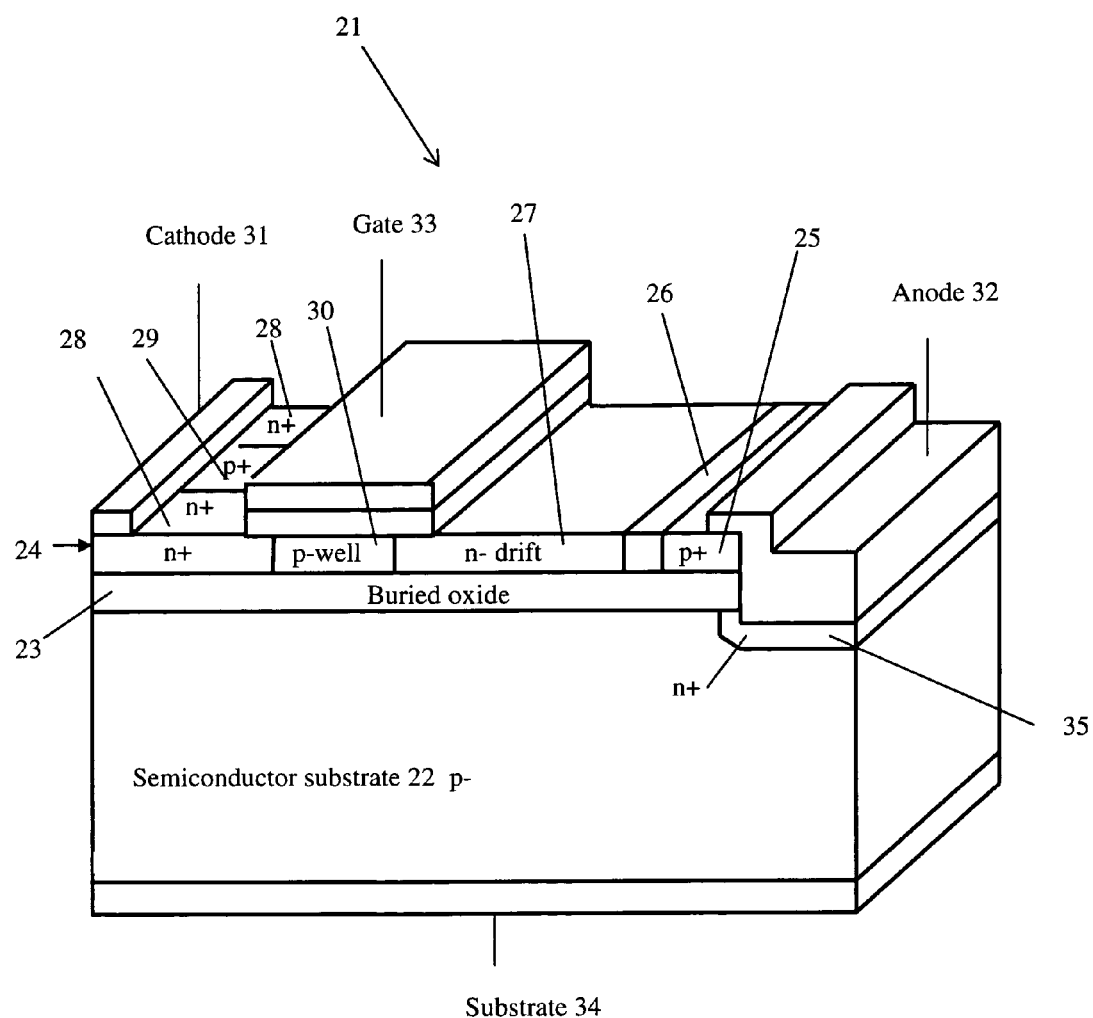
FIG. 5 is a schematic perspective view of an example of a device in accordance with an embodiment of the present invention.
Figure 6:
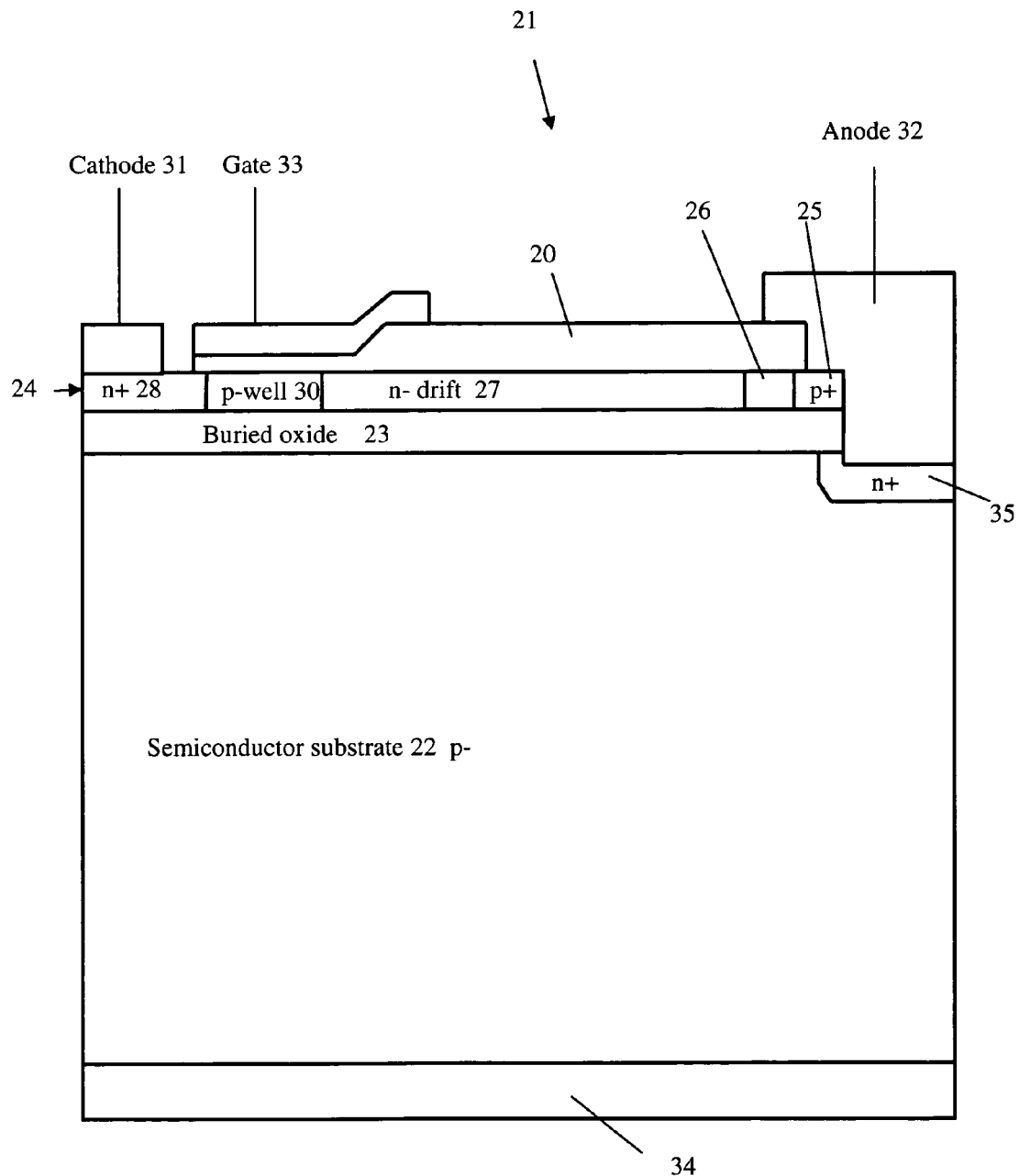
FIGS. 6 to 10 are schematic cross-sectional views of the device of FIG. 5.

Referring to FIGS. 5 and 6, there is shown a high voltage/power LIGBT 21 using partial SOI technology as an example of a device according to an embodiment of the present invention.

The device 21 has a lowly doped p− semiconductor substrate 22 on which is formed a thin electrically insulating oxide layer 23, which is conventionally known as a buried oxide layer 23. A semiconductor layer 24 is formed on the buried oxide layer 23 as is known per se in SOI technology.

The semiconductor layer 24 includes several semiconductor regions of different doping types and levels. In particular, the semiconductor layer 24 includes at one end a highly doped p+ anode injector region 25. Adjacent the anode injector region 25 is a highly doped n type buffer region 26. Adjacent the buffer region 26 is a relatively long lowly doped n− drift region 27. As is known per se, the drift region 27, which is characteristic of high voltage/power devices, withstands the largest portion of the voltage across the main terminals of the device when the device is in the off-state and operating in the voltage blocking mode. In the voltage blocking mode, the drift region 27 is partially or ideally completely depleted of mobile charge carriers.

At the end of the semiconductor layer 24 opposite the anode injector region 25 there are in this example plural alternating highly doped n+ and p+ regions 28,29 extending transversely of the semiconductor layer 24. A p-well 30 is provided between the alternating highly doped n+, p+ regions 28,29 and the n− drift region 27. A low voltage terminal (cathode) 31 is in contact with and therefore electrically connected to the alternating n+, p+ regions 28,29. A high voltage terminal (anode) 32 is in contact with and therefore electrically connected to the anode injector region 25 and the immediately adjacent end of the buried oxide layer 23. A control terminal (gate) 33 is provided over an insulated gate (i.e. MOS gate) placed at the upper surface of the p-well 30 and partially over the alternating n+, p+ regions 28,29 and the adjacent end of the drift region 27. A substrate terminal 34 is connected to the bottom face of the substrate 22 opposite the buried oxide layer 23.

As is known, application of appropriate voltages to the various terminals 31,32,33,34 causes the device 21 to operate in forward or reverse blocking mode or in forward conduction mode. In the blocking mode, the vast majority of the voltage is supported by a depletion region that forms in the drift region 27 and in the substrate 22 below the buried oxide 23. To operate the device 21 in the forward conducting mode, a positive voltage of sufficient magnitude is applied to the control terminal (gate) 33, which causes a surface inversion layer to be formed in the p-well 30 under the insulated gate connected to the control terminal 33. This leads to the formation of an electron current which flows from the cathode region 28 via the inversion layer into the drift region 27. This electron current serves as the base current for the pnp transistor formed between the p+ anode injector region 25 (emitter)/n− drift region 27 (base)/p-well 30 (collector). As a result, this pnp transistor turns on, leading to significant hole injection from the p+ anode injector region 25 into the n− drift region 27, which leads to a significant increase in the conductivity of the n-drift region 27 and as a result a low voltage drop across this region. This phenomenon is known as "conductivity modulation". The increase in the conductivity is governed by the charge stored in the n-drift region 27 (base), which can be moderated by adjusting the doping and length of the buffer region 26. A high level of charge is beneficial in reducing the on-state losses but leads to higher turn-off losses. The optimal level and distribution of charge is dependent on the particular application and the frequency of operation.

As mentioned above, a particular problem with the operation of conventional IGBTs is that, during the on-state of the device, at sufficiently high levels of current density a parasitic pnp bipolar transistor forms between the anode injector region, the drift region or the well conventionally provided around the anode injector, and the substrate. At sufficiently high levels of current, this transistor becomes active, which causes parasitic charge carriers to be injected deep into the substrate instead of or in addition to injection of charge carriers into the drift region 27.

The effects of this parasitic transistor are avoided in the preferred embodiment by the provision of a highly doped n+ region 35 which is electrically connected to the high voltage terminal 32 and in close proximity to the anode injector region 25. In this example, the electrical connection with the high voltage terminal 32 is by direct physical contact with the high voltage terminal 32. In this example, the highly doped n+ region 35 is formed under the high voltage terminal 32 and partially (e.g. by lateral diffusion) under the adjacent end of the buried oxide layer 23. The highly doped n+ region 35 is not in physical contact with the anode injector region 25 nor is it connected via any other semiconductor layer to the anode injector region 25. Because the anode injector region 25 is electrically connected to the high voltage terminal 32, the anode injector region 25 and the highly doped n+ region 35 are at the same potential. As will be appreciated, the anode injector region 25 is not in direct physical contact or indirect contact with the substrate 22 via any semiconductor layer.

Unlike the similar highly doped region in the device of U.S. Pat. No. 5,113,236, the highly doped n+ region 35 in the present example is not separate from the device 21 as such, but instead is part of the device 21 and is locally and directly connected to the high voltage terminal 32 and electrically connected to the anode injector region 25. This allows a local depletion region to spread into the substrate 22 under the drift region 27. The junction formed by the highly doped n+ region 35 with the substrate 22 is in close proximity to the junction formed by the p-well 30 and the drift region 27. During the voltage blocking mode, these two junctions are reverse-biased and act together to increase the breakdown voltage of the device 21.

Importantly, because the anode injector region 25 is effectively isolated from the substrate 22 (by the buried oxide layer 23 and the highly doped n+ region 35), there is no formation of a parasitic transistor having the anode injector region 25 as the emitter and the substrate 22 as the collector. This in turn means that the LIGBT 21 using partial SOI technology allows injection of carriers from the anode injector region 25 virtually solely into the buffer region 26 and drift region 27, with no injection of carriers into the substrate 22.

In an example, for a 700 V LIGBT, the p– substrate 2 has a doping of $10^{14}$ cm$^{-3}$ to $5 \cdot 10^{14}$ cm$^{-3}$, the buried oxide 23 has a thickness between 0.1 μm to 2 μm, the semiconductor layer 24 has a thickness below 2 μm and typically between 0.1 μm and 0.5 μm, the drift region has a doping of around $5 \cdot 10^{14}$ cm$^{-3}$ to $10^{16}$ cm$^{-3}$, the n+ region 28 and the n+ region 25 are made within the same CMOS fabrication step and have a surface doping concentration of around $10^{21}$ cm$^{-3}$, the p+ region 29 and the p+ anode injector region 25 are made within the same CMOS fabrication step and have a surface doping concentration of around $10^{20}$ cm$^{-3}$, and the p-well 30 and the n– buffer region 26 have a doping of around $10^{16}$ cm$^{-3}$ to $8 \cdot 10^{16}$ cm$^{-3}$. The length of the inversion layer (i.e. the MOS channel) at the surface of the p-well 30 is typically between 1 μm and 3 μm. The insulated gate formed above the p-well 30 is made of a thin layer of oxide (e.g. 20 to 50 nm) and a layer of highly doped polysilicon (e.g. 1 μm in thickness and $10^{21}$ cm$^{-3}$ in doping). The n– drift length (from the p-well 30 end to the n– buffer region 26 end) is 30 to 50 μm. The anode and cathode terminals are made of aluminium and may fill partially or fully the trench created during the manufacturing process to form the n+ region 35. The aluminium layers can be typically 0.5 to 3 μm thick. Several such layers of aluminium within different metal levels may be used to form terminals or interconnections within the integrated circuit. The thickness of the p– substrate 22 is given by the wafer thickness and is typically between 100 μm and 500 μm.

FIG. 6 is a cross-sectional view of the device 21 of FIG. 5. The insulated gate is shown to extend over the drift region and an additional insulating region 20, comprising a field oxide is shown extending over the drift region. This layer 20 is common in lateral power devices and its drawing is omitted in FIG. 5 and other figures for clarity.

Figure 7:
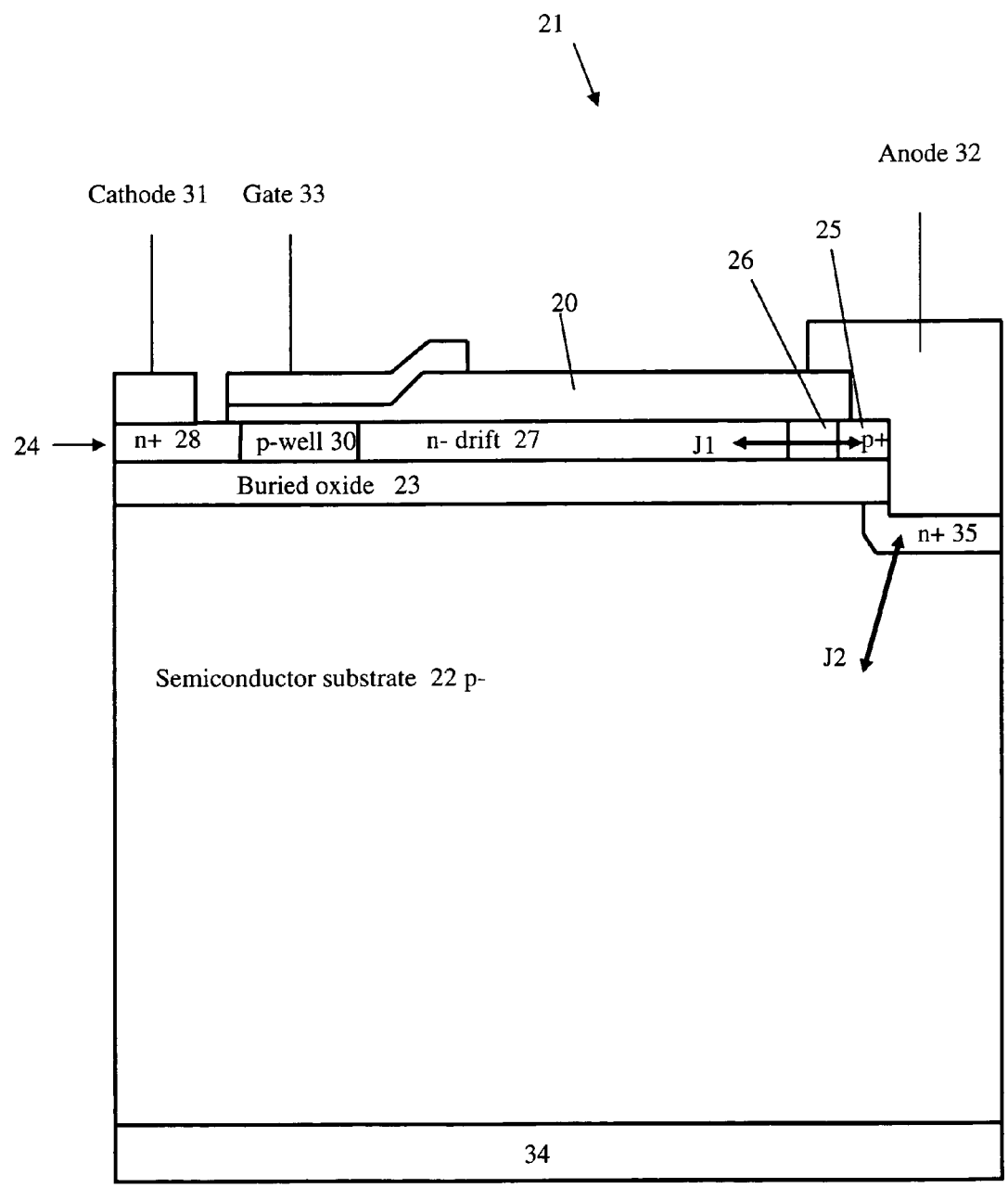

Referring to FIG. 7, a first junction J1 is formed between the anode injector region 25 and the buffer region 26/drift region 27 and a second junction J2 is formed between the highly doped n+ region 35 and the substrate 22. These two junctions J1,J2 are separate and isolated from each other but have a common anode terminal. When the device 21 is in the on-state, the first junction J1 is forward biased whilst the second junction J2 remains reverse biased. Minority charge carriers are injected through the first junction J1 when the device 21 is in the on-state, these minority carriers effectively being confined to the drift region 27 and virtually no minority carriers being injected into the substrate. The second junction J2 is reverse-biased at all times and, during the voltage blocking mode, supports a large voltage.

Figure 8:
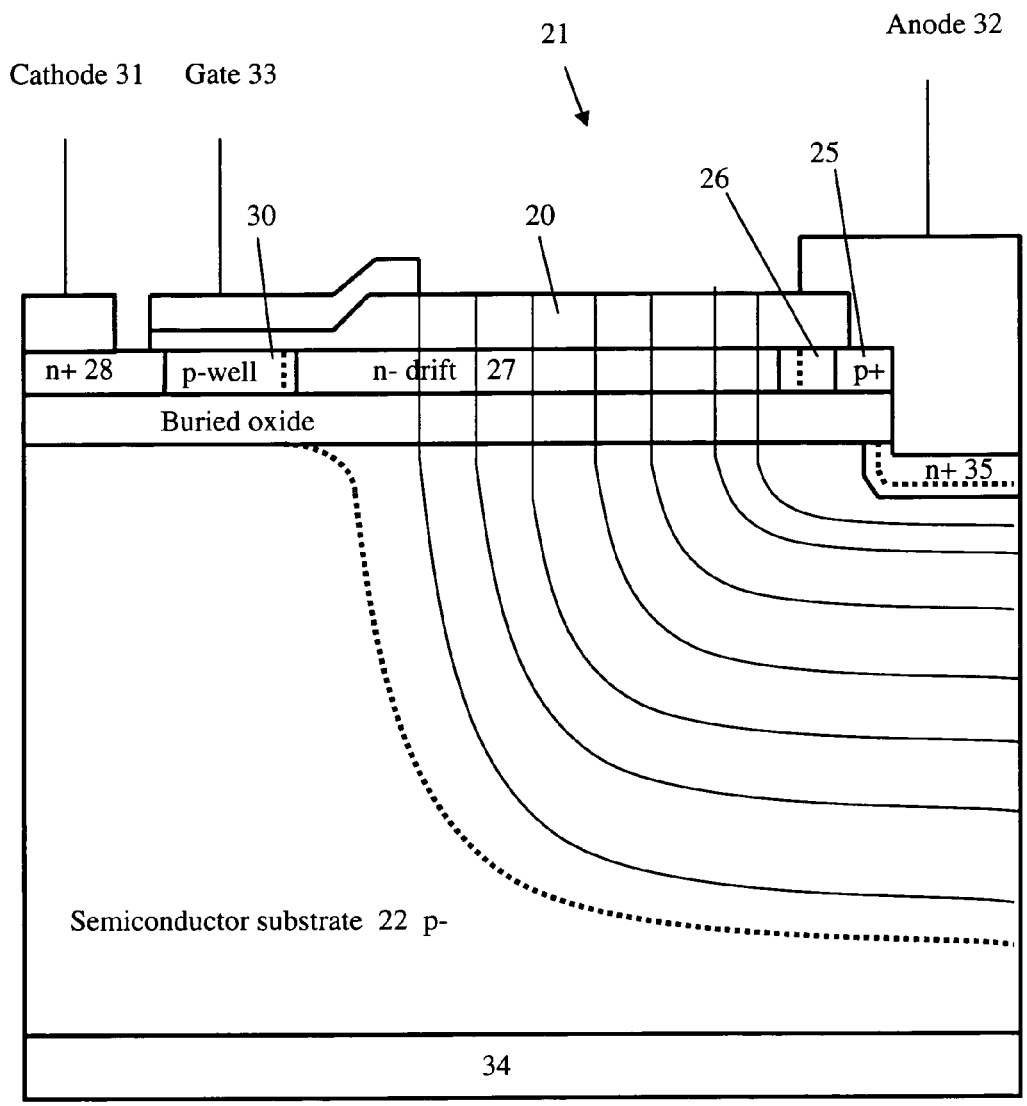

FIG. 8 shows schematically the potential distribution (solid lines) and the edges of the depletion region (dashed lines) when the device 21 is operating in the voltage blocking mode (i.e. the off-state) and is supporting a voltage drop close to the breakdown limit. The drift region 27 is entirely depleted and the depletion region extends deeply into the substrate 22.

Figure 9:
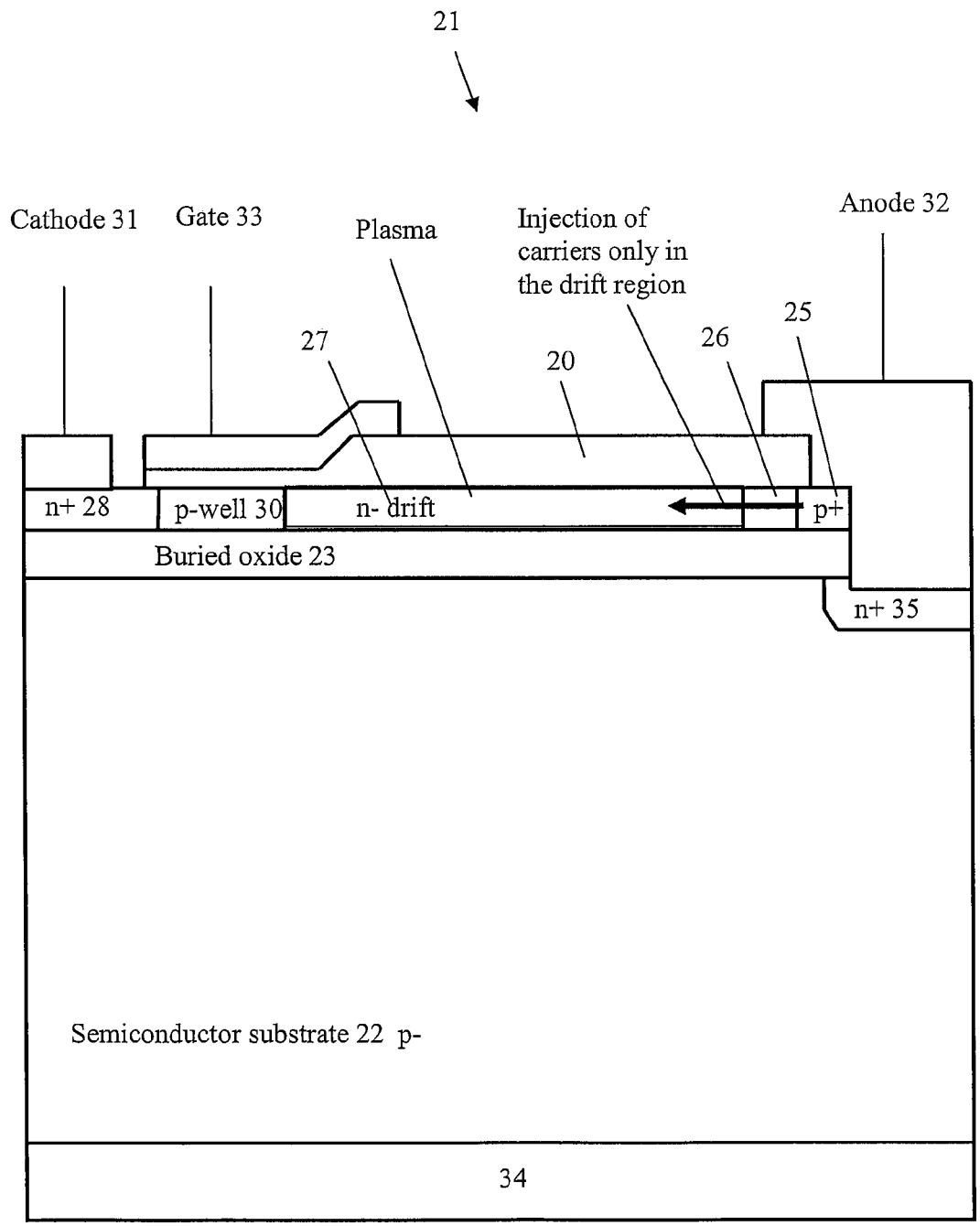

FIG. 9 shows schematically that carrier injection is virtually confined to the drift region 27. As is known per se, injection of the carriers is followed by plasma formation and conductivity modulation, which reduces the on-state resistance of the device 21.

The highly doped n+ region 35 can be formed by etching through the end of the semiconductor layer 24 and the buried oxide layer 23 followed by its implantation and/or diffusion. During the fabrication process, this layer 35 may be self-aligned to the trench that is formed by etching. This trench may be subsequently partially or fully filled with one or more layers of metals and further connected to the high voltage terminal 32.

In certain embodiments as discussed further below, there may be plural discrete anode injector regions 25 provided transversely of the drift region 27, and a corresponding plurality of discrete highly doped n+ regions 35, each highly doped n+ region 35 not being in physical contact with the respective anode injector regions 25, thus avoiding formation of any parasitic transistors.

Figure 10:
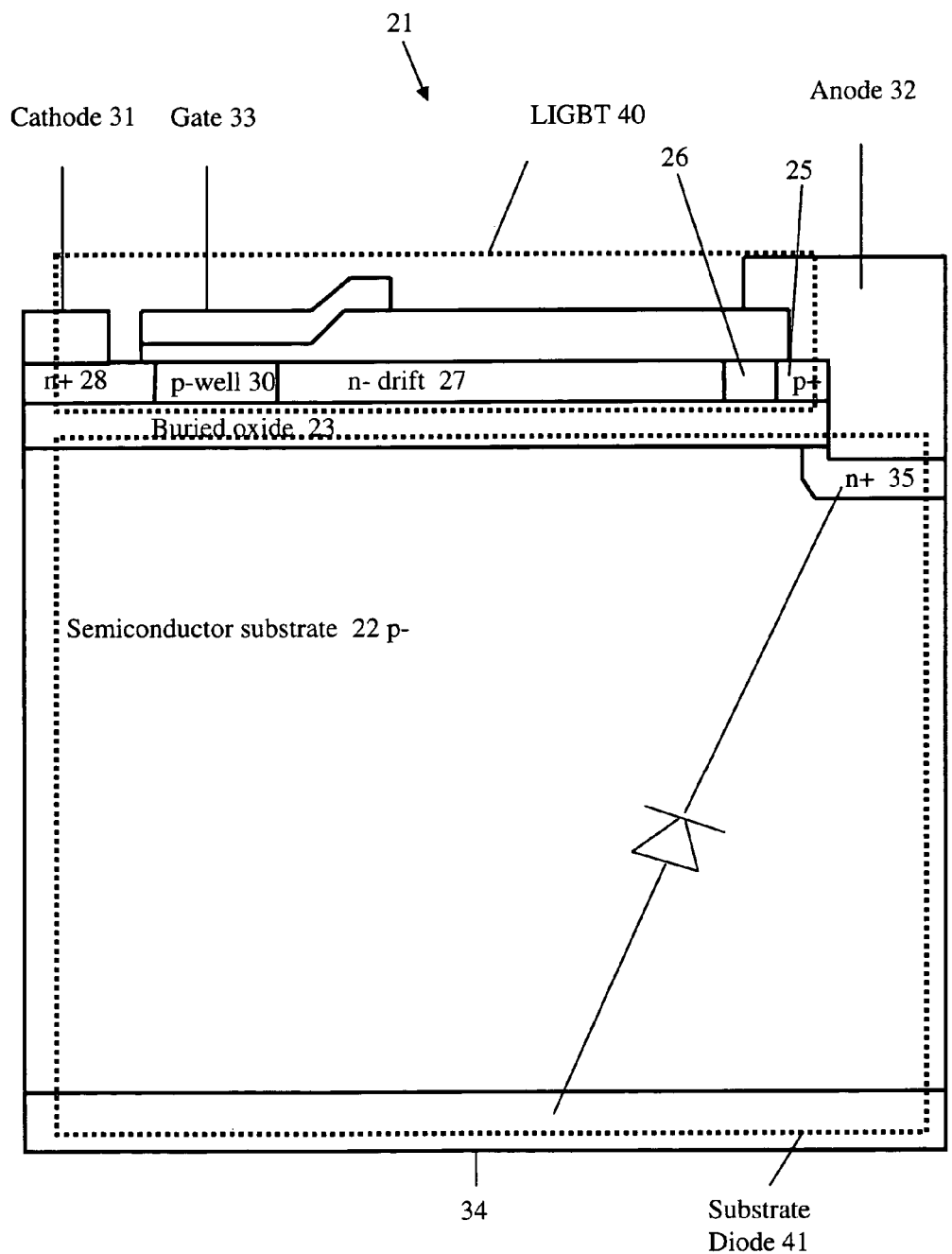

FIG. 10 shows schematically how the device 21 can be regarded as a "surface" lateral IGBT 40 in combination with a vertical anti-parallel body diode 41 between the substrate 22 and the highly doped region 35 adjacent the high voltage terminal 32. The surface LIGBT 40 and the body diode 41 are isolated from each other by the buried oxide layer 23. The highly doped n+ region 35 forms the cathode of the diode 41 and the substrate 22 forms the body/anode of the diode 41 and which is normally connected to the cathode of the surface LIGBT 40. This effective diode 41 can be used as a "body diode" in applications such as lighting or motor control. This is an important application of the preferred LIGBT device 21 as conventional IGBTs do not have body diodes (body diodes typically being found in MOSFETs).

In the following description and the corresponding drawings, further examples of devices according to embodiments of the present invention are disclosed. In each case, features like those of the first example shown in FIG. 5 have the same reference numerals and will not be described further.

Figure 11:
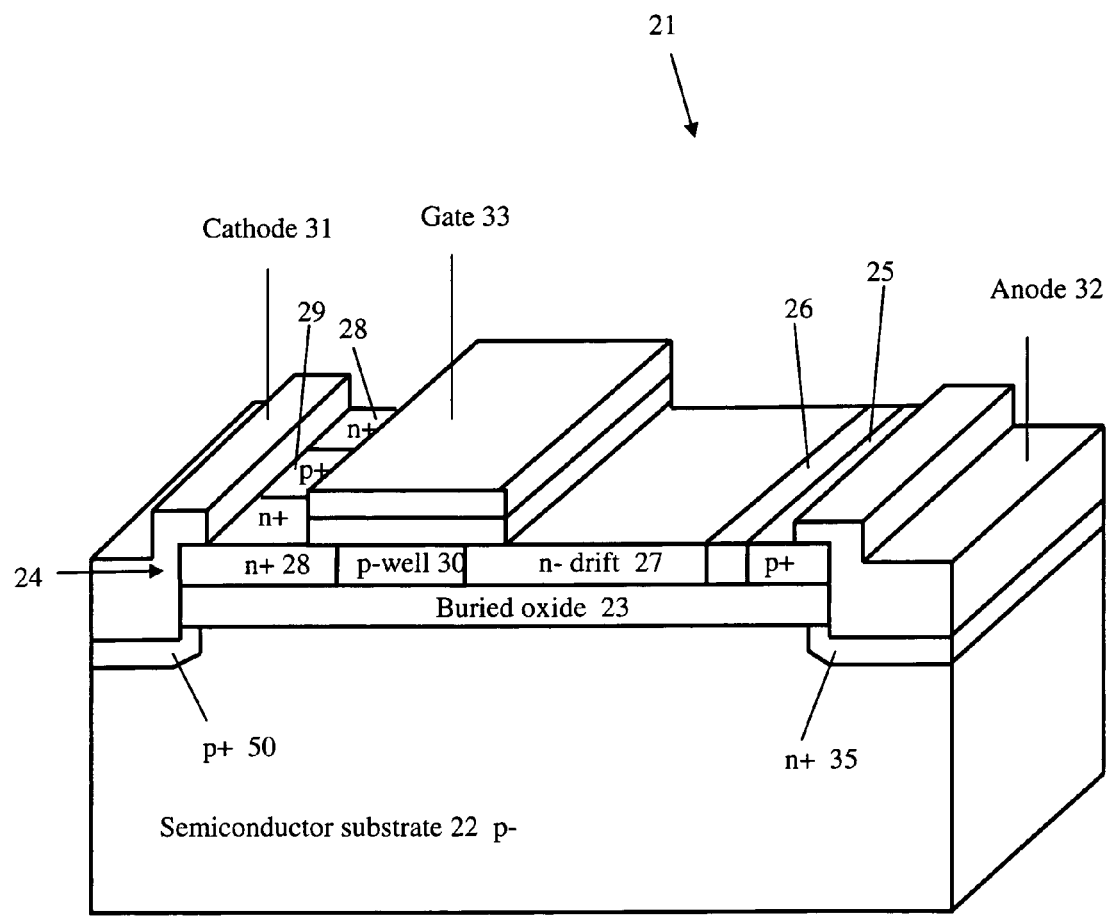
FIGS. 11 and 12 are schematic perspective views of another example of a device in accordance with an embodiment of the present invention.

FIG. 11 shows schematically another example of a device 21 according to an embodiment of the present invention. In this example, the substrate 22 is electrically connected to the low voltage terminal 31 via a relatively highly doped p+ region 50 around the low voltage terminal 31. In an example manufacturing process, the semiconductor layer 24 and the buried oxide layer 23 are etched from the top side. The highly doped p+ region 50 around the low voltage terminal 31 is formed by implantation and makes an ohmic contact between the low voltage terminal 31 and the substrate 22. The etching of the semiconductor layer 24 and the buried oxide layer 23 at the end of the device 21 adjacent the low voltage terminal 31 can be carried out at the same time, during the same process step, as the etching of the semiconductor layer 24 and buried oxide layer 23 at the end of the device 21 adjacent the high voltage terminal 32.

Figure 12:
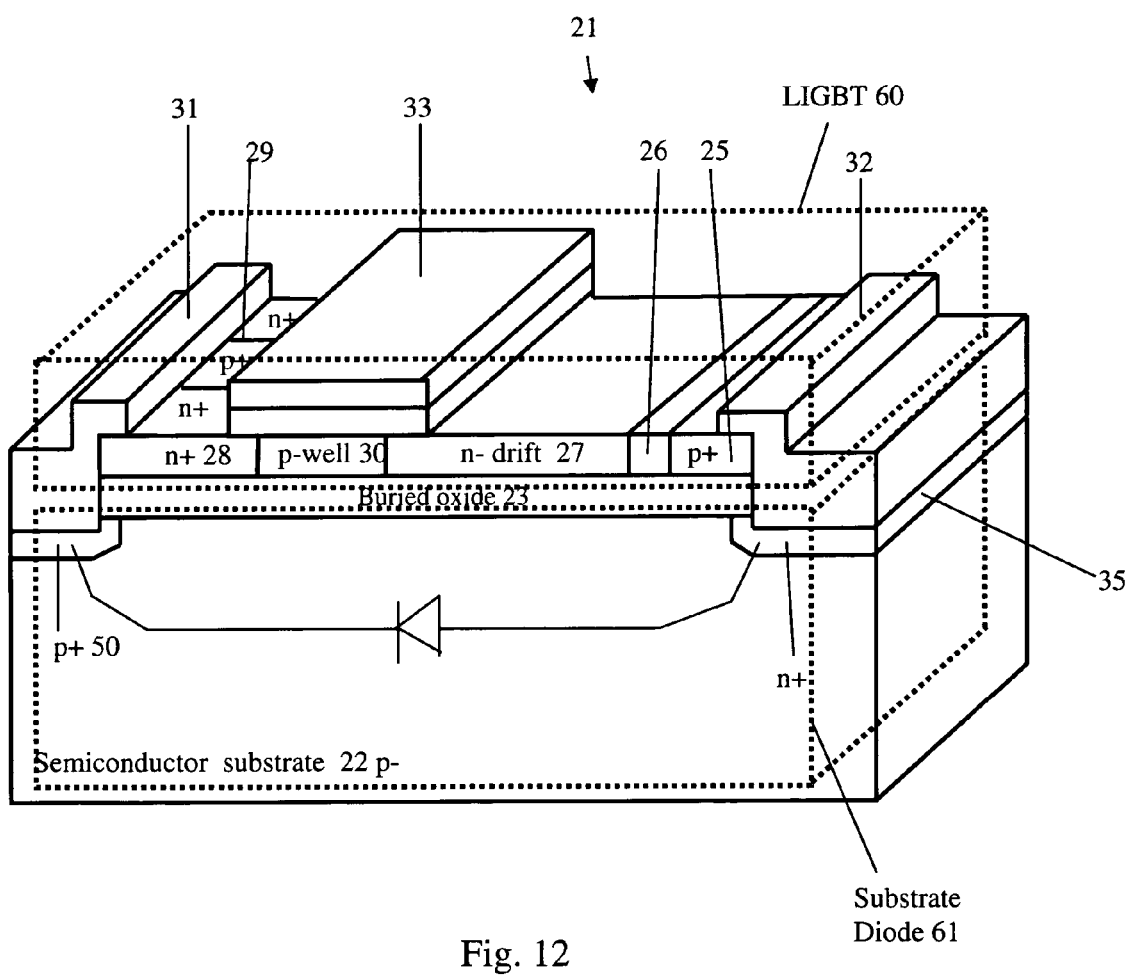

FIG. 12 shows schematically how the example of FIG. 11 can be regarded as providing a "surface" LIGBT 60 in combination with a lateral anti-parallel body diode 61 which is effectively formed between the highly doped n+ region 35 adjacent the high voltage terminal 32 and the highly doped p+ region 50 adjacent the low voltage terminal 31.

Figure 13:
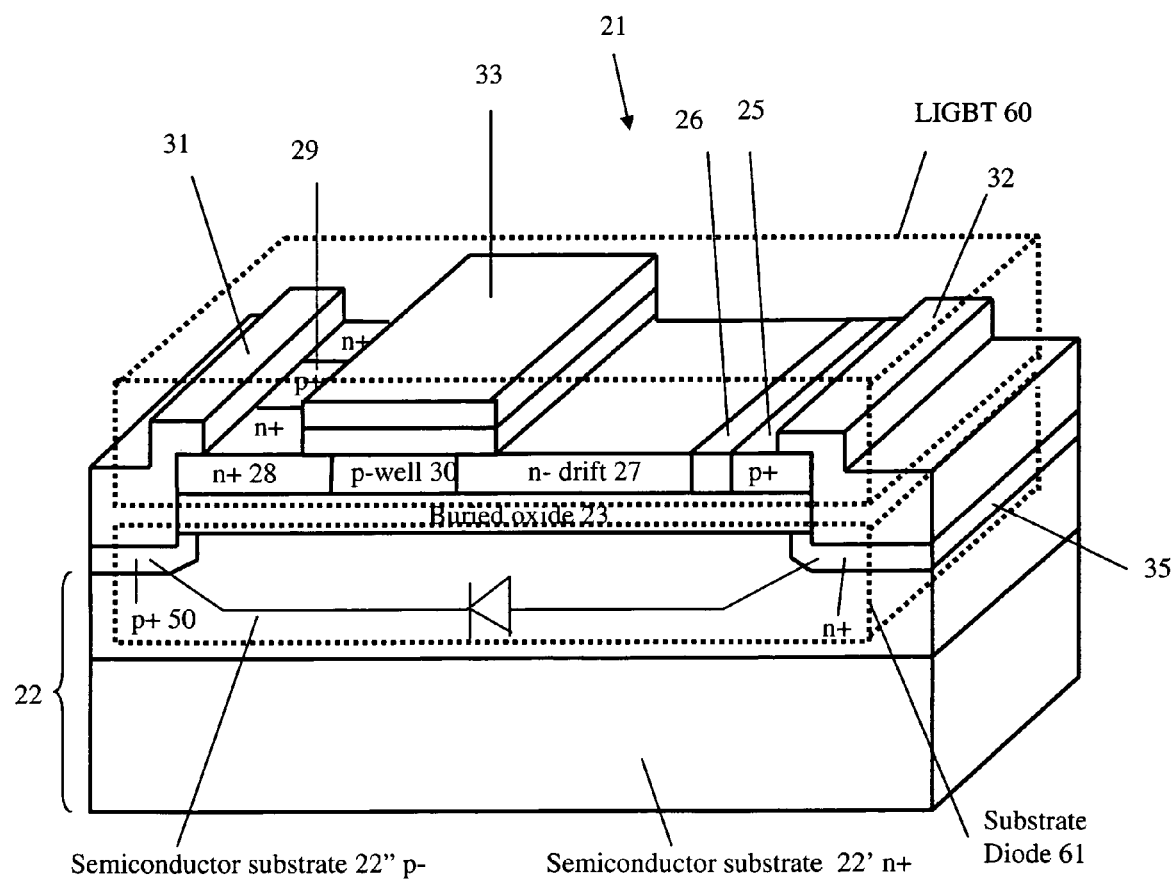
FIG. 13 is a schematic perspective view of another example of a device in accordance with an embodiment of the present invention.

FIG. 13 shows schematically another example of a device 21 according to an embodiment of the present invention. In this example, the substrate 22 has two levels of doping. A bottom layer 22' of the substrate is relatively highly doped, as n+ or p+, whereas an upper layer 22" of the substrate is relatively lowly doped p–. This arrangement constrains the anti-parallel body diode 61 to be only within the upper layer 22" of the substrate 22.

Figure 14:
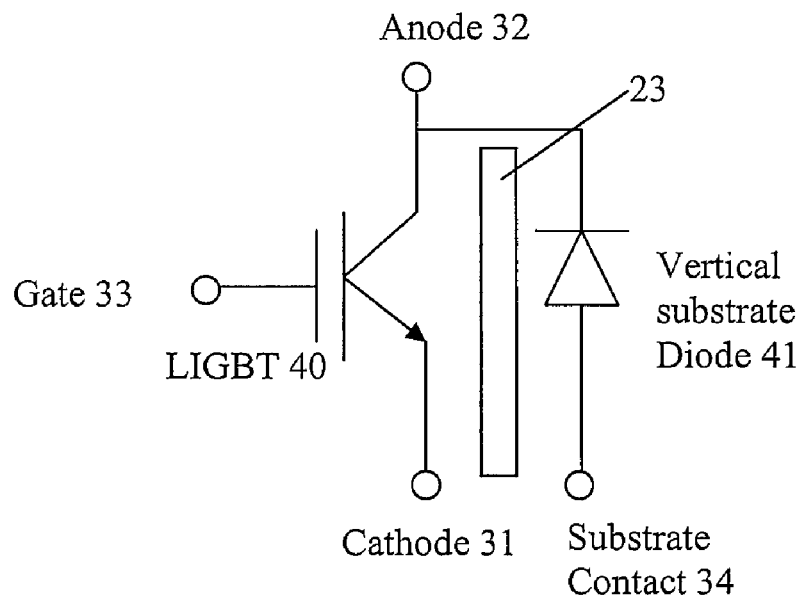
Figure 14:
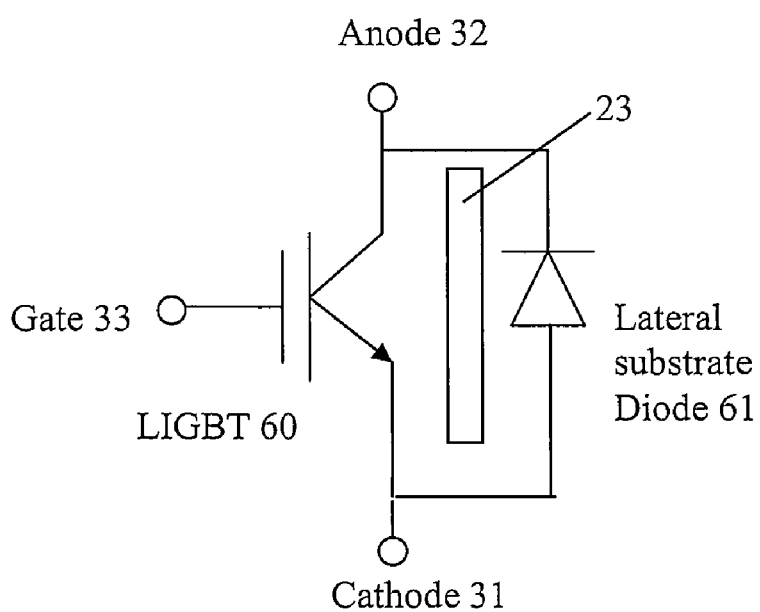

FIG. 14 shows equivalent circuits for examples of devices according to an embodiment of the present invention. FIG. 14(a) shows an equivalent circuit for the device of FIG. 10. There is shown the surface LIGBT 40 and the integrated anti-parallel vertical body diode 41 which has its anode connected to the substrate terminal 34. The substrate terminal 34 may be connected externally to the low voltage terminal 31 of the LIGBT 40. The buried oxide layer 23 is shown schematically by a shaded rectangle.

In FIG. 14(b), which shows the equivalent circuit for the device of FIGS. 11 to 13, there is shown the surface LIGBT 60 and the integrated anti-parallel lateral diode 61.

Figure 15:
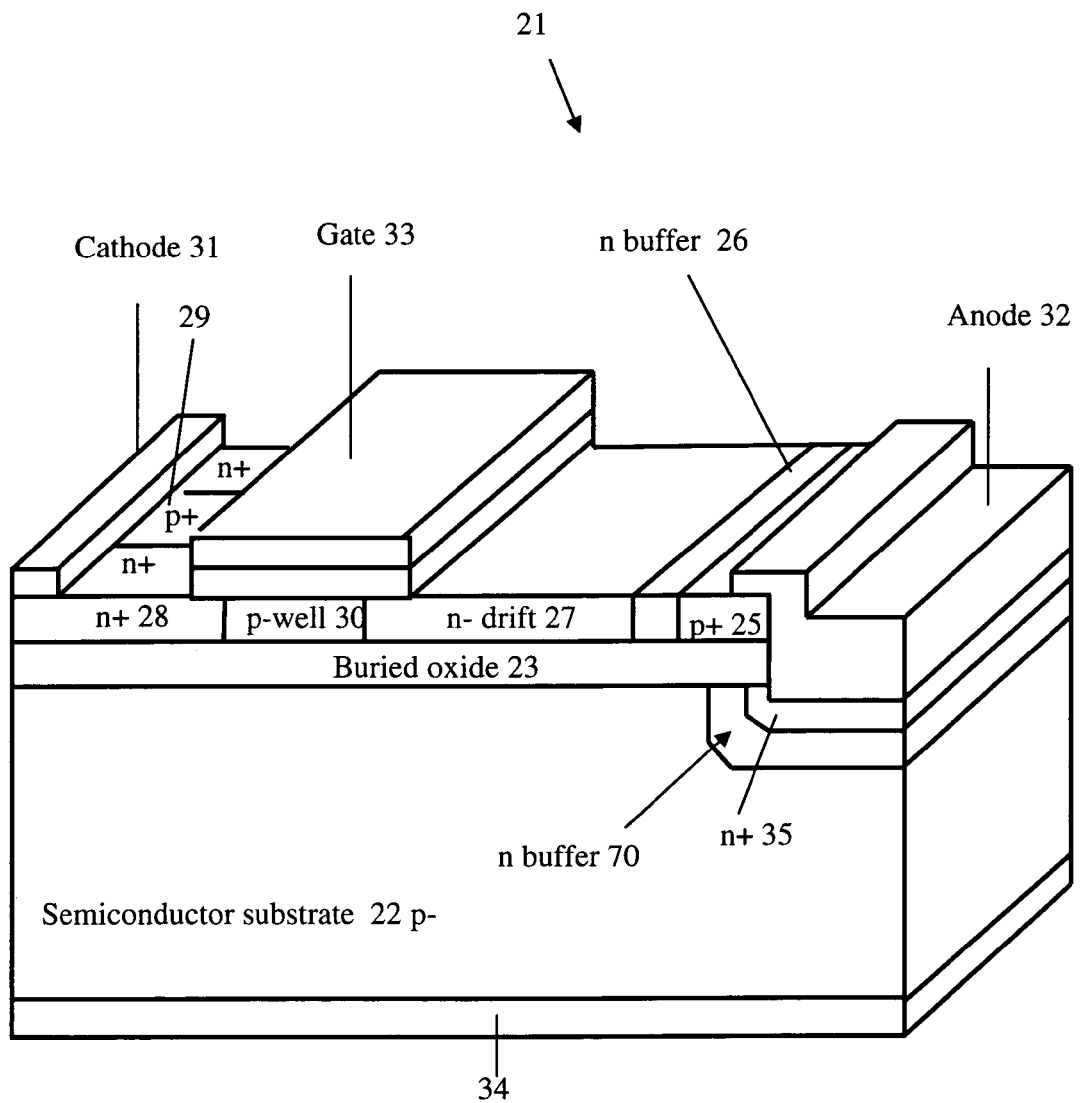

In the example of FIG. 15, an additional n buffer region 70 is formed around the highly doped n+ region 35 at the high voltage terminal 32. This additional buffer region 70 "smoothes" the junction between the highly doped n+ region 35 and the substrate 22, which serves to increase the breakdown voltage. This additional buffer region 70 can be formed during the same diffusion step, preferably using the same mask, as the buffer region 26 adjacent the anode injector region 25.

Figure 16:
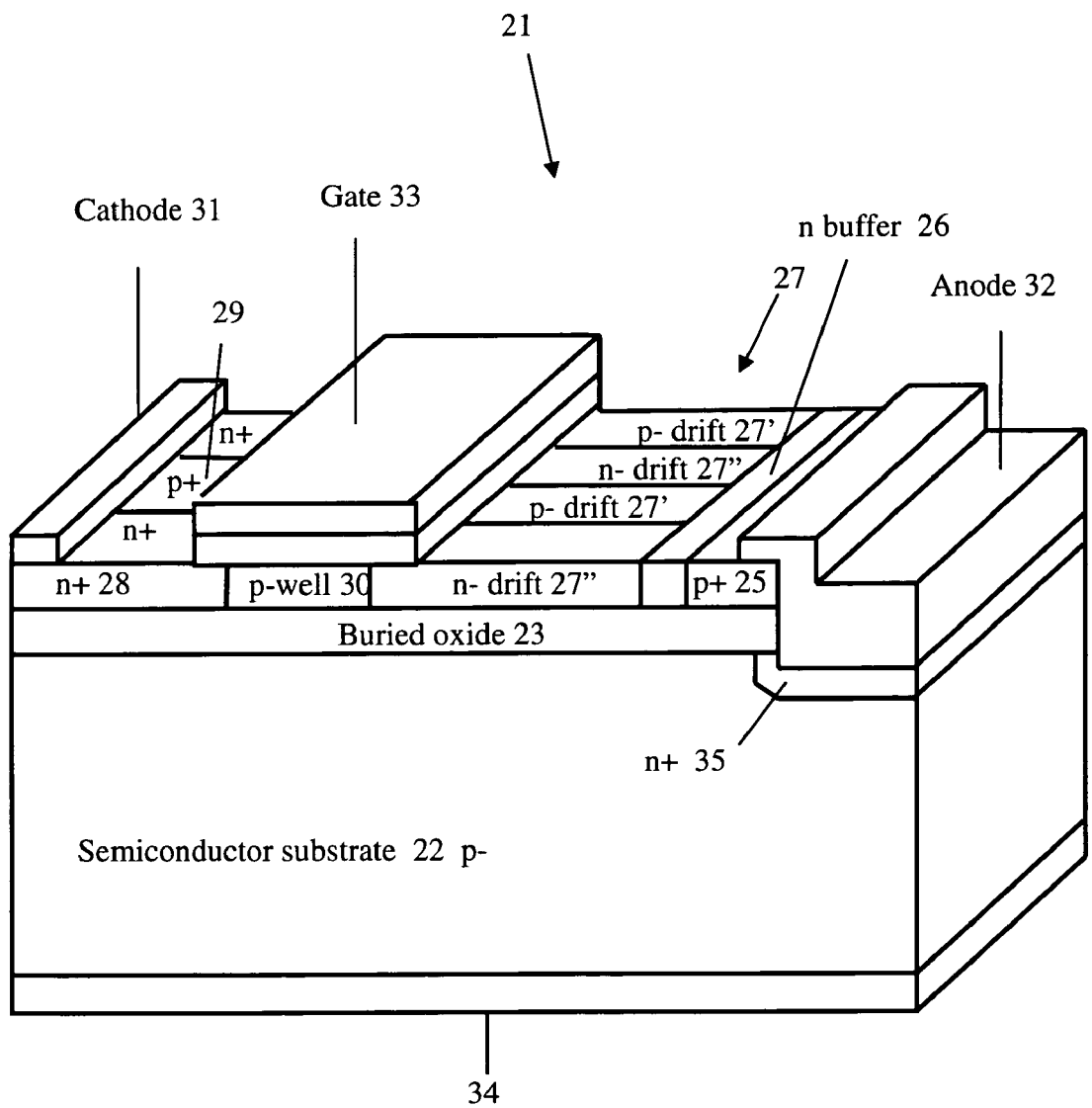

The example of FIG. 16 uses a superjunction (3D RESURF) arrangement in which the drift region 27 is composed of adjacent and alternating lowly doped regions of p– type 27' and n– type 27" extending longitudinally of the drift region 27. The doping levels in these drift region stripes 27',27" are set taking into account the doping level within the depletion region that is formed in the substrate 22 when the device 21 is in the voltage blocking mode. This arrangement allows an optimal charge compensation to be made, which achieves an optimal breakdown capability for the device 21.

Figure 17:
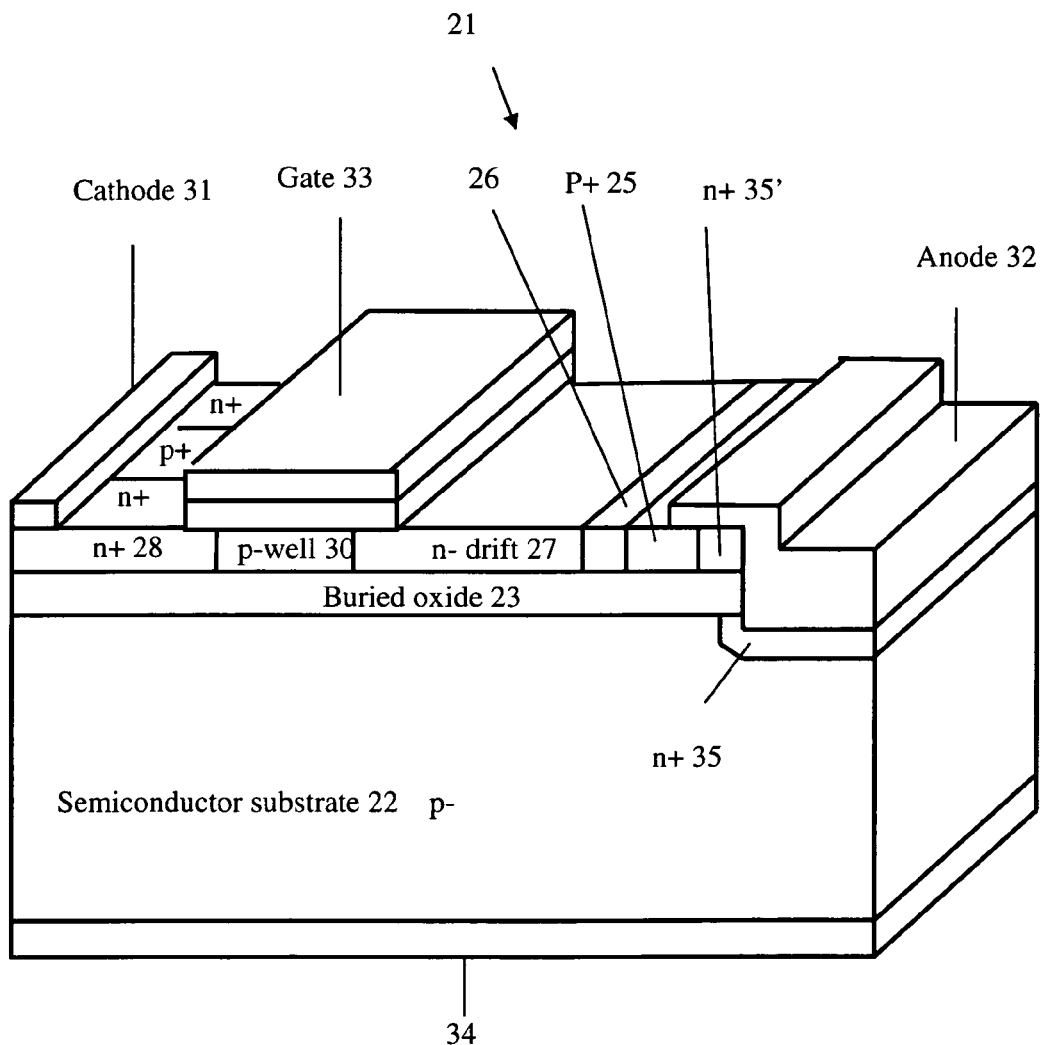

The example of FIG. 17 is similar to the example of FIG. 5 except that the highly doped n+ region 35 has a portion 35' that is provided above the buried oxide layer 23 and between the anode injector region 25 and the high voltage terminal 32. The high voltage terminal 32 connects the n+ region 35, the n+ region 35' and the anode injector region 25. This arrangement may be more suitable for particular designs or for structures such as anode-shorted LIGBTs.

Figure 18:
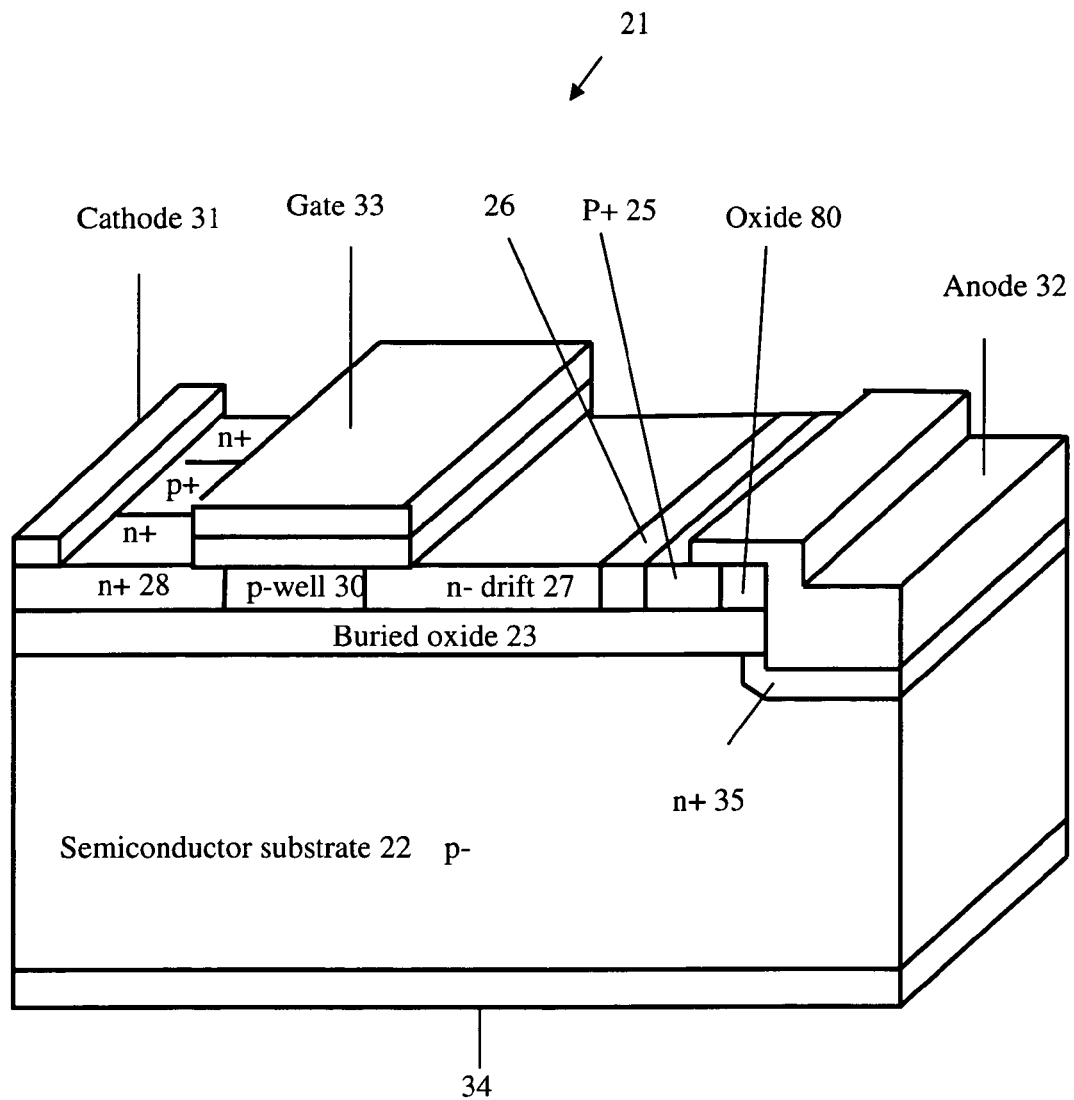

In the example of FIG. 18, a region 80 of oxide is formed adjacent the anode injector region 25 on the side that will be adjacent the high voltage terminal 32. This additional oxide region 80 makes it easier during manufacture to etch through the top of the device 21 during formation of the highly doped n+ region 35 at the high voltage terminal 32.

Figure 19:
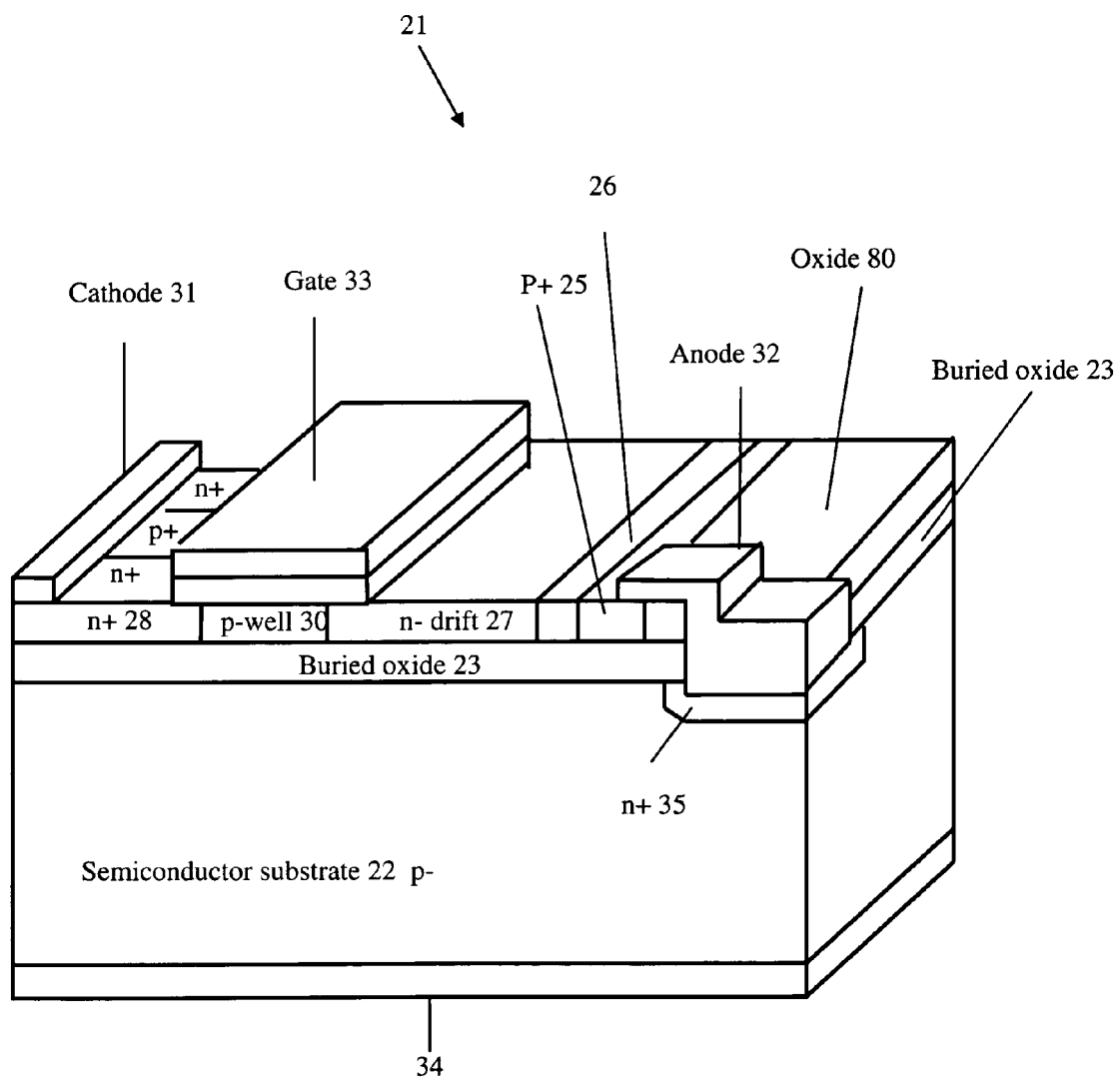
Figure 20:
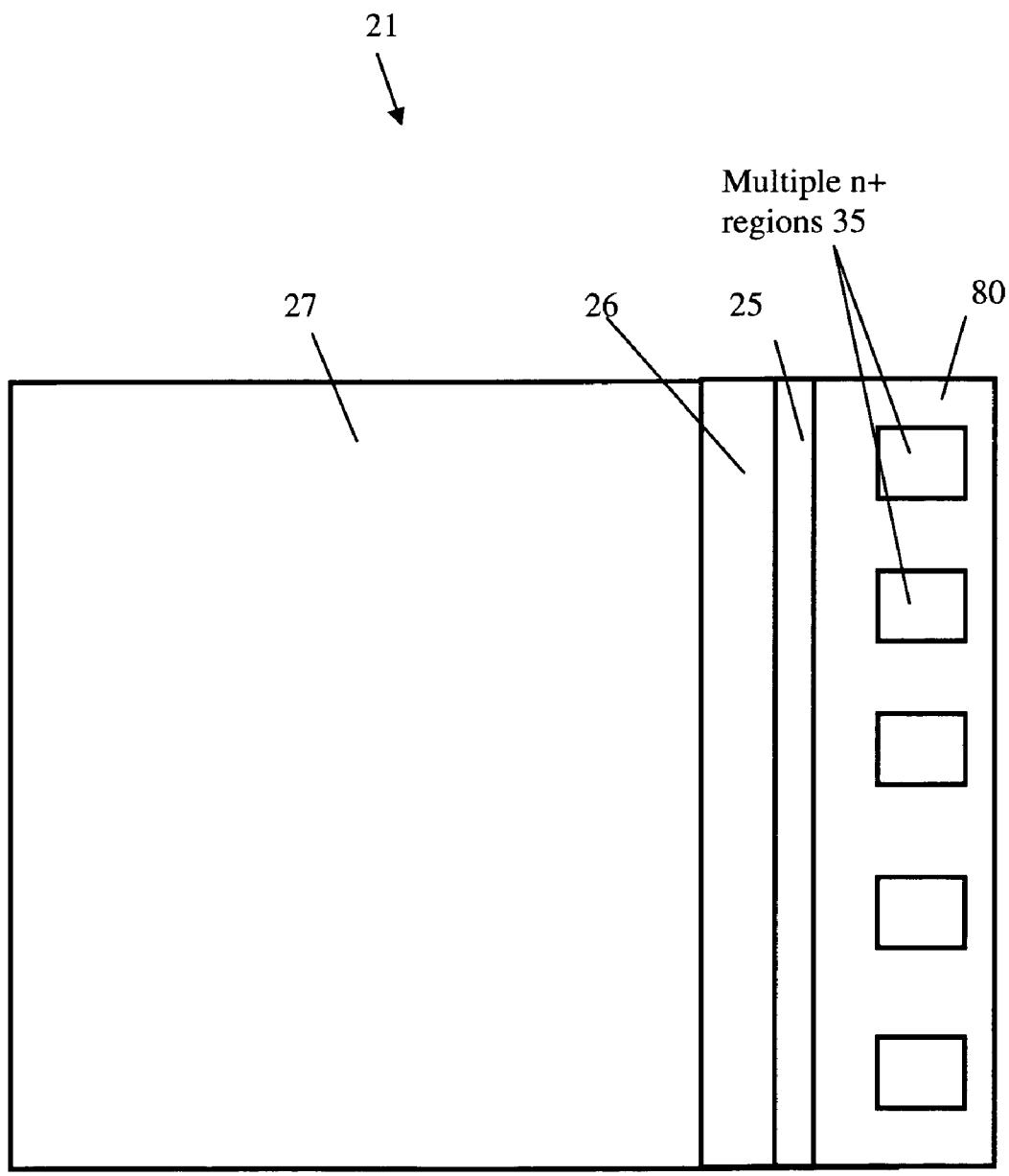

In the example of FIGS. 19 and 20, the n+ region 35 does not extend across the full length of the anode region. Small trenches are formed locally through the oxide region 80 to form a plurality of n+ regions 35 (only one being shown in FIG. 19), all connected to the anode terminal 32. This may be helpful from a manufacturing point of view. The multiple n+ regions 35 form multiple junctions with the substrate. These junctions should be placed close together so that the depletion regions they generate during blocking mode should join together, allowing an effective third dimensional RESURF effect. FIG. 20 shows schematically in plan the plural highly doped regions 35 adjacent the high voltage terminal 32. These small "islands" 35 are placed close together and are electrically connected to the same high voltage terminal 32.

In the example of FIG. 21, a trench 90 is formed within the-drift region 27, for example by etching. An additional highly doped n+ region 91 is formed in the surface of the substrate 22 at the bottom of the trench 90. The trench 90 is then filled with a floating terminal contact 92. Plural such trenches 90 may be formed in the drift region 27, each with its own highly doped n+ region 91, as discussed below. The or each additional n+ region 91 is not connected directly to one of the main terminals 31,32,33,34 of the device 21 and is therefore floating. The purpose of these additional n+ regions 91 is to spread the depletion region into the substrate 22 in a more favourable way (i.e. a more uniform manner) so as to ensure a more uniform spread of the potential at the surface of the drift region 27 and thus improve the breakdown voltage capability of the device 21.

In the example of FIG. 22, plural discrete trenches 90 are formed. In this example, the plural discrete trenches 90 are provided as two longitudinally displaced rows each containing several trenches 90 spanning laterally across the device 21. As in the example of FIG. 21, each trench 90 has a highly doped n+ region 91 formed underneath it in the substrate 22. The trenches 90 are again filled with contacts 92 which are floating. The space between the trenches 90 allows current to flow between the trenches in the on-state of the device 21.

The examples described above have principally made use of a thin semiconductor layer 24. The example of FIG. 23 uses a thick semiconductor layer 24. In the examples described above it was assumed that the semiconductor layer was thin, typically between 0.1 μm and 0.5 μm. In this example, a thicker semiconductor layer 24 is used, the thickness in an example being above 1 μm and typically between 1.5 μm and 5 μm. Very thick semiconductor layers 24 may be used, for example semiconductor layers having a thickness in excess of 10 μm. In the example shown in FIG. 23, an n– well 100 is formed around the anode injector region 25. A p+ region 101 is formed at the low voltage terminal 31 adjacent the n+,p+ regions 28,29. The p– well 30 at the low voltage terminal 31 extends under the n+,p+ regions 28,29 and p+ region.101 at the low voltage terminal 31. The p+ region 29 is optional in this arrangement (normally being present only to minimise the latch-up) as the contact to the p-well 100 is provided via the p+ region 101. In the example shown, a vertical oxide layer 102 is formed between the high voltage terminal 32 and the anode injector region 25 and n-well 100 so as to isolate the short-circuit that forms between the anode injector region 25 and the n-well 100. This vertical oxide layer 102 can be formed before or after etching of the semiconductor layer 24 takes place to allow the highly doped n+ region 35 to be formed.

Embodiments of the present invention have been described with particular reference to the examples illustrated. However, it will be appreciated that variations and modifications may be made to the examples described within the scope of the present invention.

The invention claimed:

1. A high voltage/power semiconductor device, the device comprising:
   a relatively lowly doped substrate;
   an insulating layer on the substrate;
   a semiconductor layer on the insulating layer;
   a low voltage terminal and a high voltage terminal each electrically connected to the semiconductor layer;
   a control terminal;
   the semiconductor layer including a drift region of a first conductivity type, the substrate being of the second conductivity type;
   the semiconductor layer including a relatively highly doped injector region of the second conductivity type between the drift region and the high voltage terminal, said relatively highly doped injector region being in electrical contact with the high voltage terminal and not being physically connected via any semiconductor layer to the substrate; and,
   a relatively highly doped region of the first conductivity type in electrical contact with the said relatively highly doped injector region and the high voltage terminal and forming a semiconductor junction with the substrate;
   the combination of the insulating layer and the relatively highly doped region of the first conductivity type effectively isolating the relatively highly doped injector region from the substrate.

2. A device according to claim 1, comprising plural relatively highly doped injector regions of the second conductivity type between the drift region and the high voltage terminal, said relatively highly doped injector regions each being in electrical contact with the high voltage terminal and not being connected via any semiconductor layer to the substrate, and a corresponding plurality of relatively highly doped regions of the first conductivity type in electrical contact with the respective relatively highly doped injector regions and the high voltage terminal and forming a corresponding plurality of semiconductor junctions with the substrate.

3. A device according to claim 1, comprising a buffer region of the first conductivity type between the drift region and said relatively highly doped injector region.

4. A device according to claim 1, comprising a relatively highly doped region of the first conductivity type electrically connected to the low voltage terminal.

5. A device according to claim 4, comprising a relatively highly doped region of the second conductivity type electrically connected to the low voltage terminal.

6. A device according to claim 4, comprising a well region of the second conductivity type between the drift region and the relatively highly doped region that is electrically connected to the low voltage terminal.

7. A device according to claim 6, comprising an insulated gate at the upper surface of said well region of the second conductivity type and at the upper surface of part of the relatively highly doped region of the first conductivity type and at the upper surface of part of the drift region.

8. A device according to claim 1, comprising a relatively highly doped region of the second conductivity type adjacent the low voltage terminal, said relatively highly doped region of the second conductivity type electrically connecting the substrate to the low voltage terminal.

9. A device according to claim 1, wherein the substrate has at least two layers, a first layer of the substrate adjacent the insulating layer being relatively lowly doped of the second conductivity type, and a second layer of the substrate adjacent said first layer being relatively highly doped of the first or second conductivity type.

10. A device according to claim 1, comprising a buffer region of the first conductivity type around said relatively highly doped region of the first conductivity type in electrical contact with the high voltage terminal and forming a semiconductor junction with the substrate.

11. A device according to claim 1, wherein the drift region includes plural regions of alternating conductivity type extending longitudinally of the device.

12. A device according to claim 1, comprising a further relatively highly doped region of the first conductivity type between the high voltage terminal and the relatively highly doped injector region, the high voltage terminal being electrically connected to both this further relatively highly doped region of the first conductivity type and the relatively highly doped injector region.

13. A device according to claim 1, comprising an insulating region between the high voltage terminal and the relatively highly doped injector region.

14. A device according to claim 1, comprising at least one trench in the drift region, the at least one trench having formed underneath at least one further relatively highly doped region of the first conductivity type which forms at least one semiconductor junction with the substrate.

15. A device according to claim 1, wherein the device is a lateral insulated gate bipolar transistor (LIGBT) and comprises an anti-parallel diode, the anti-parallel diode containing at least one semiconductor junction formed between the said relatively highly doped region of the first conductivity type and the substrate of the second conductivity type.

16. A device according to claim 1, wherein the device is a lateral insulated gate bipolar transistor (LIGBT) where the substrate takes a large fraction of the blocking voltage while the device is in the off-state and/or during transient signals while there is virtually no injection of mobile carriers into the substrate during on-state.

17. A device according to claim 5, comprising a well region of the second conductivity type between the drift region and the relatively highly doped region that is electrically connected to the low voltage terminal.

* * * * *